United States Patent [19]
Okamura et al.

[11] Patent Number: 5,381,117
[45] Date of Patent: Jan. 10, 1995

[54] RESONATOR HAVING LOOP-SHAPED ELECTRODE

[75] Inventors: Hisatake Okamura; Masahiro Kasahara; Tetsuo Taniguchi, all of Nagaokakyo, Japan

[73] Assignee: Murata Manufacturing Co., Ltd., Kyoto, Japan

[21] Appl. No.: 112,627

[22] Filed: Aug. 26, 1993

Related U.S. Application Data

[63] Continuation of Ser. No. 832,793, Feb. 7, 1992, abandoned.

[30] Foreign Application Priority Data

| Feb. 15, 1991 | [JP] | Japan | 3-021875 |
| Jun. 11, 1991 | [JP] | Japan | 3-138836 |
| Jan. 10, 1992 | [JP] | Japan | 4-021749 |
| Jan. 10, 1992 | [JP] | Japan | 4-021750 |

[51] Int. Cl.$^6$ .............................. H03H 7/01
[52] U.S. Cl. ........................ 333/175; 333/185; 333/219
[58] Field of Search ............... 333/175, 177, 184, 185, 333/204, 219

[56] References Cited

U.S. PATENT DOCUMENTS

| 4,614,925 | 9/1986 | Kane | 333/185 |
| 5,105,176 | 4/1992 | Okamura et al. | 333/219 |

FOREIGN PATENT DOCUMENTS

| 0120102 | 6/1987 | Japan | 333/204 |
| 0298202 | 12/1987 | Japan | 333/219 |
| 0284917 | 11/1988 | Japan | 333/185 |

Primary Examiner—Seungsook Ham
Attorney, Agent, or Firm—Ostrolenk, Faber, Gerb & Soffen

[57] ABSTRACT

A coil electrode pattern is disposed on one surface of a plate consisting of a dielectric material. The coil electrode pattern is formed in a loop shape. An input/output terminal pattern and an earth terminal pattern are drawn out from the coil electrode pattern toward an end portion of the plate. The input/output terminal pattern and the earth terminal pattern are disposed at a distance from each other so as to provide a predetermined impedance. An earth electrode pattern is formed opposite the dielectric coil electrode pattern with the plate between them. An earth terminal pattern is formed to the earth electrode pattern. The earth terminal pattern of the earth electrode pattern is connected to the earth terminal pattern of the coil electrode pattern. A trimming electrode may be formed for adjusting the resonance frequency of the resonator optionally.

19 Claims, 28 Drawing Sheets

F I G. 1
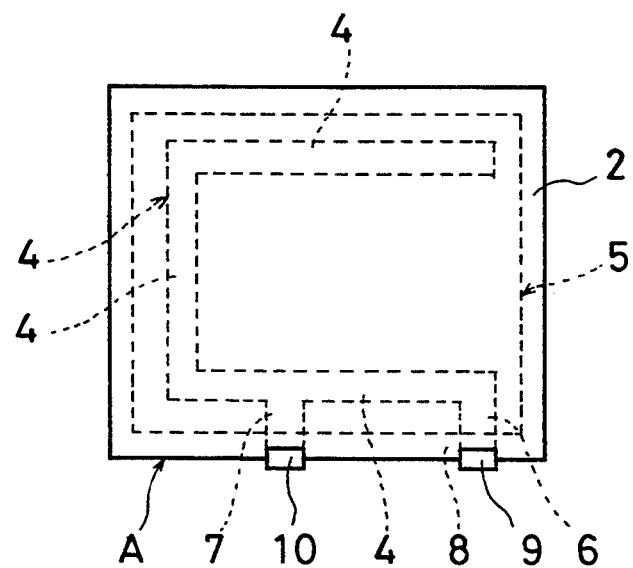

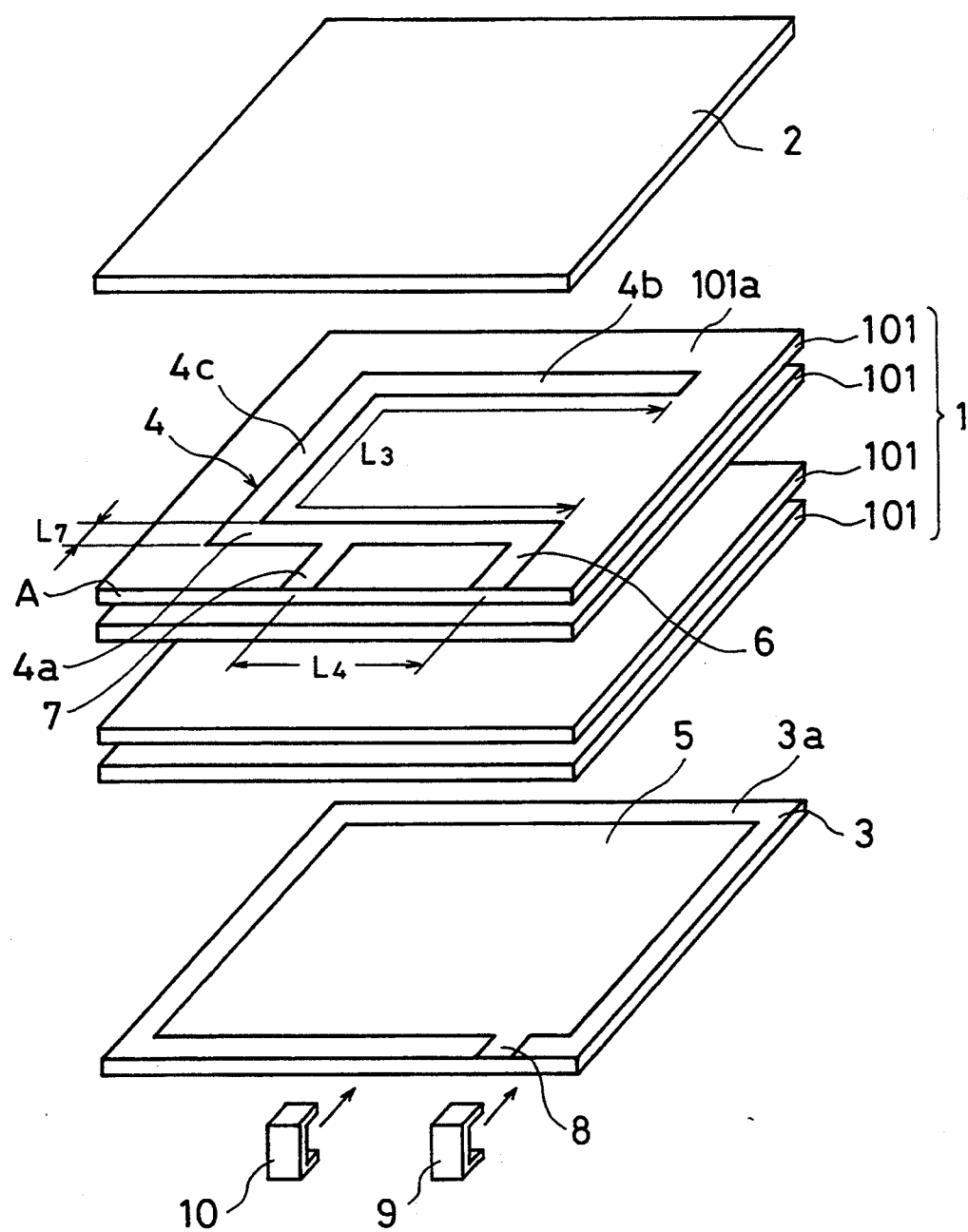
F I G. 2

F I G. 2 1
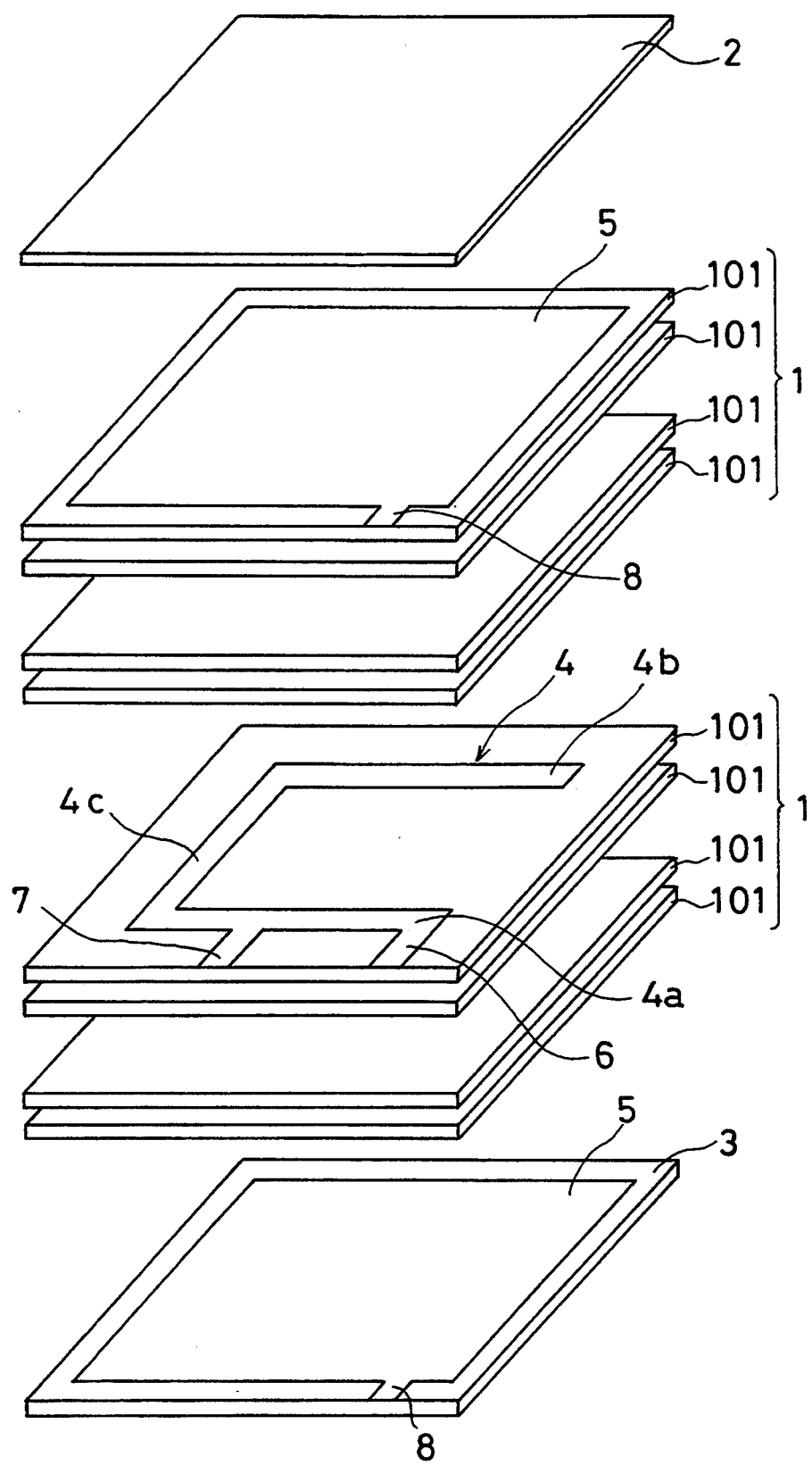

F I G. 3 1
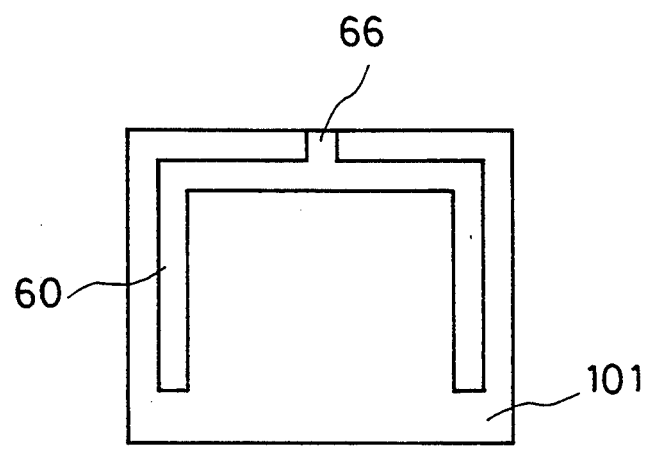

F I G. 32
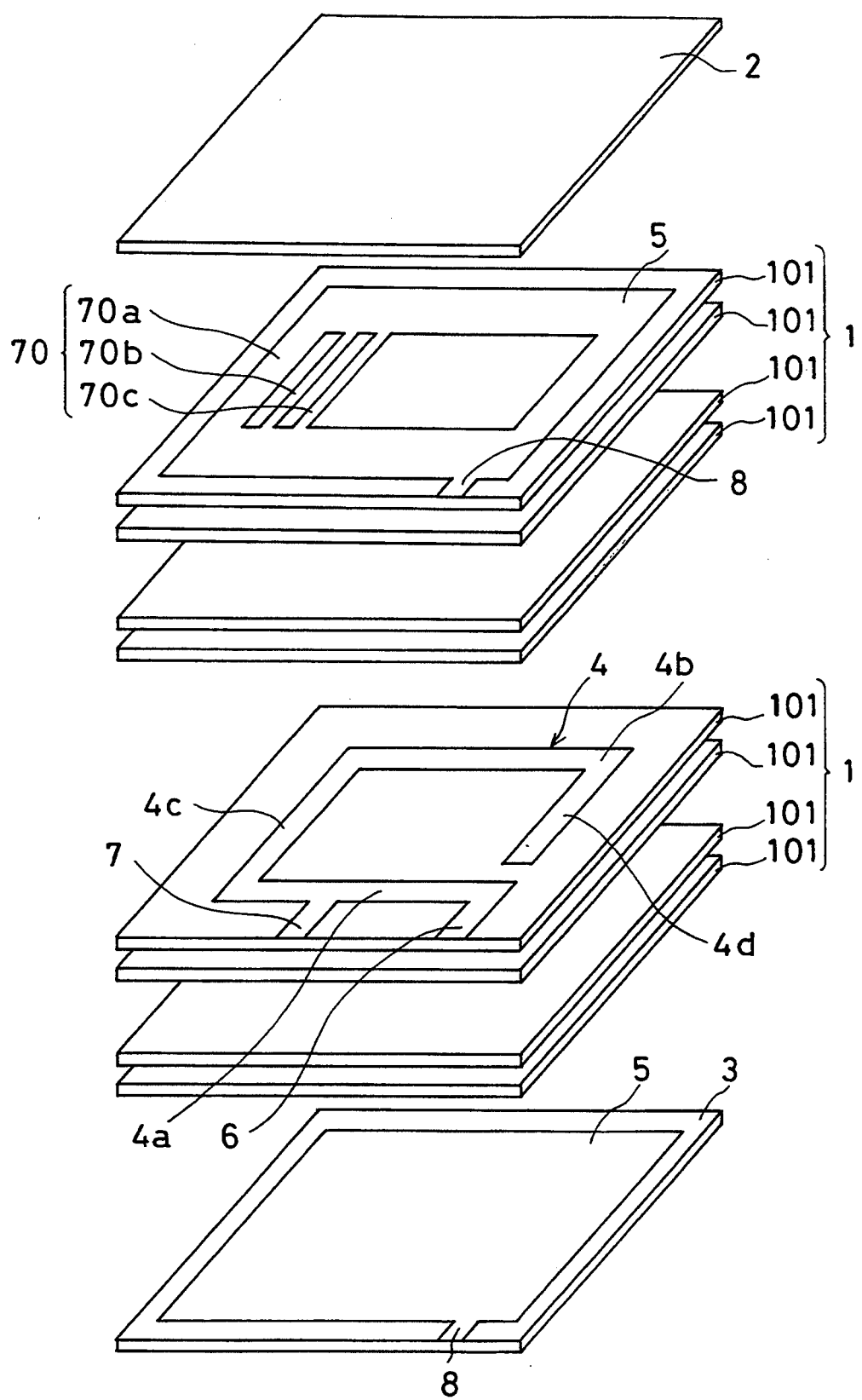

F I G. 33
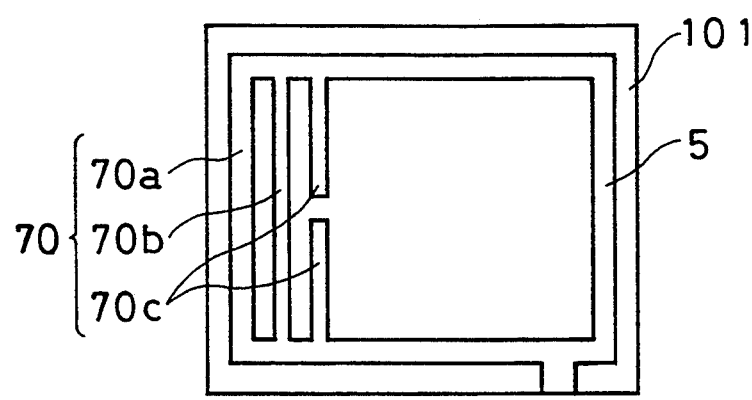

RESONATOR HAVING LOOP-SHAPED ELECTRODE

This is a continuation of application Ser. No. 07/832,793 filed on Feb. 7, 1992, now abandoned.

BACKGROUND OF THE INVENTION

1. Field of the Invention

The present invention relates to a resonator for operation at several hundred MHz to several GHz used in a portable radio and the like, and particularly, it relates to a dielectric-laminate type resonator.

2. Description of the Prior Art

Conventional resonators are divided roughly into the resonator using a strip line and the resonator using a coil pattern.

As the resonator using the strip line, there is a resonator of ½ wavelength whose line is open at opposite ends as shown in FIG. 34 and FIG. 35, and a resonator of ¼ wavelength whose line is open at one end and short-circuited at the other end as shown in FIG. 36.

Meanwhile, as the resonator using the coil pattern, as shown in FIG. 37, there is the resonator in which a spiral-shaped coil pattern 201 and an earth pattern 203 are formed on both sides of a dielectric layer 202 which is clamped therebetween.

In the above-mentioned conventional resonators, however, such problems as shown hereinafter were encountered respectively.

1. resonator using the strip line (a) A resonator having the resonance frequency of 2 to 3 GHz becomes substantially large.

That is, lengths $L_1$, $L_2$ of the strip line are determined as shown in Equation 1 (resonator of ½ wavelength) and Equation 2 (resonator of ¼ wavelength).

$$L_1 = \frac{1}{2} \lambda \times \frac{1}{\sqrt{\epsilon}} \qquad \text{Equation 1}$$

$$L_2 = \frac{1}{4} \lambda \times \frac{1}{\sqrt{\epsilon}} \qquad \text{Equation 2}$$

where, $\lambda$: wavelength, $\epsilon$: dielectric constant of dielectric laminate sheet Hereupon, at present, a dielectric constant of a dielectric laminate sheet which is capable of being fired simultaneously with silver or copper and has a good temperature characteristic can not be made so large, resulting in about $\epsilon = 10$. Thus, in the above Equations 1 and 2, when $\epsilon = 10$, $L_1 = 15.8$ mm and $L_2 = 7.9$ mm, which are very long, thus resulting in a large resonator.

(b) In the resonator and the like, it is desirable to adjust the impedance depending on the apparatus into which it is incorporated (to adjust the matching of impedances of the resonator and an apparatus). However, in case of the strip-line type, since the impedance has a specific value for every strip line, it is impossible to adjust the matching even when the input/output position is changed.

2. resonator using the coil pattern

Since the coil pattern has a spiral shape, magnetic fluxes are influenced by one another between the adjoining patterns, thus an electric current flow is difficult to obtain. Therefore, a substantial resistance increases and the Q value becomes lower.

For example, in FIG. 37, since the electric current flows in the same direction (both in a direction A) in a first pattern piece 201a and a second pattern piece 201b, magnetic fields cancel each other to cause the magnetic fluxes to become coarse, and consequently an electric current flow is disturbed and the substantial resistance is increased.

The resonance frequency of the resonator is decided by the dimension of strip line or coil-pattern, so once the pattern is formed, the resonance frequency can not be adjusted. Therefore, when the dimension of the pattern is in error, the resonance frequency of the resonator is shifted from a predetermined value, resulting in an inferior product.

SUMMARY OF THE INVENTION

The present invention has been devised in view of such present circumstances, and therefore, it is an object thereof to provide a resonator which has a high Q which can be minimized, and moreover, it is possible to adjust the impedance and resonance frequency optionally.

The present invention is directed to a resonator comprising: a first electrode formed in a loop shape; a second electrode formed in a plane shape opposite the first electrode with a plate consisting of a dielectric material between the first electrode and the second electrode; an earth terminal drawn out from the first electrode toward an end portion of the plate; input/output terminal drawn out from the first electrode toward the end portion of the plate at a distance having providing a predetermined impedance from the earth terminal; and another earth terminal drawn out from the second electrode toward the end portion of the plate.

In regard to the resonator, second electrodes may be formed opposite both sides of the first electrode with dielectric plates between the first electrode and both second electrodes.

In regard to the resonator, at least one electrode of the second electrodes may be formed so as to have a somewhat larger shape than the first electrode.

In regard to the resonator, between the first electrode and at least one of the second electrodes, a third electrode having a same shape as the first electrode may be formed.

In regard to the resonator a, trimming electrode in a loop shape or a part of loop shape may be formed at a distance from the second electrode with the plate between the trimming electrode and the second electrode, and connected to the first electrode.

In regard to the resonator, plural trimming electrodes may be formed in a band shape at an inner part of the second electrode, and connected to the second electrode.

When it is constructed as stated above, because it is a so-called strip-line construction in which the first electrode and the second electrode are positioned on opposite sides, and that pattern pieces of the first electrode are not adjacent to each other as in the spiral-shaped coil pattern, the increment and decrement of a peak of an attenuation factor show very sharp characteristics, and the attenuation factor becomes flat in other frequency regions. As a result, Q can be improved remarkably.

Moreover, since the first electrode has a loop shape, the element size becomes smaller. In addition, since the impedance can be adjusted by just changing a distance between the input/output terminal and the earth terminal of the first electrode, it is very simple to adjust the impedance.

The floating capacitance between the trimming electrode and the second electrode is changed by trimming the trimming electrode, whereby the resonance frequency of the resonator is changed as well.

The shield effect for magnetic field is changed by cutting the trimming electrodes formed at an inner part of the second electrode. Hence, the magnetic field of the resonator is changed, whereby the resonance frequency is changed as well.

In these respects, the invention has an effect of providing a very excellent small-sized resonator whose Q is high and whose impedance and resonance frequency can be adjusted optionally.

The above and further objects, features, aspects and advantages of the present invention will be more fully apparent from the following detailed description of embodiments of the invention with accompanying drawings.

BRIEF DESCRIPTION OF THE DRAWINGS

FIG. 1 is a plan view of a dielectric resonator according to a first example of the present invention.

FIG. 2 is an exploded perspective view of the dielectric resonator according to the first example of the present invention.

FIG. 21 is an exploded perspective view of a dielectric resonator according to a fourth example of the present invention.

FIG. 31 is a plan view showing a modified example of the resonator of FIG. 30.

FIG. 32 is an exploded perspective view of a resonator according to a eighth example of the present invention.

FIG. 33 is a plan view showing a state of cutting a trimming electrode of the resonator of FIG. 32.

DESCRIPTION OF THE PREFERRED EMBODIMENTS (First Example)

Figure 3:
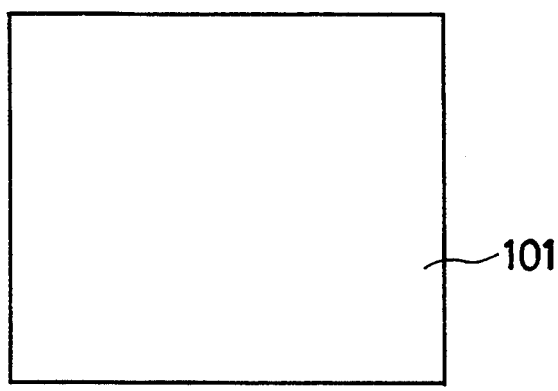
FIG. 3 is a plan view of a dielectric sheet used in the present invention.
Figure 4:
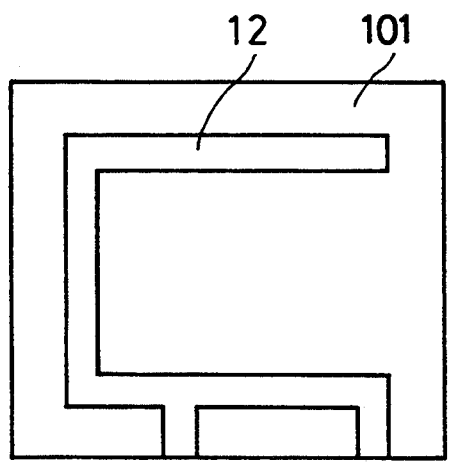
FIG. 4 is a plan view showing a state where a coil electrode pattern is formed on the dielectric sheet of FIG. 3.
Figure 5:
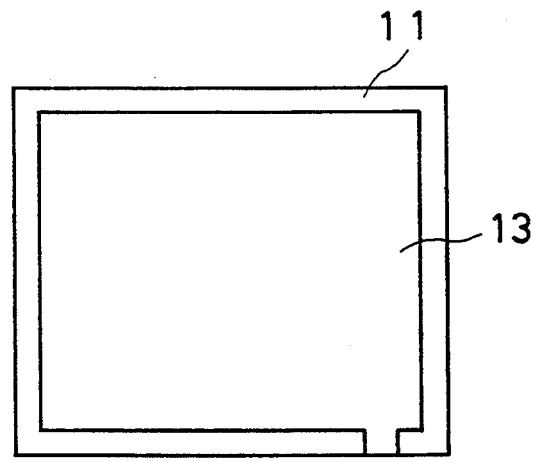
FIG. 5 is a plan view showing a state where an earth electrode pattern is formed on the dielectric sheet of FIG. 3.
Figure 6:
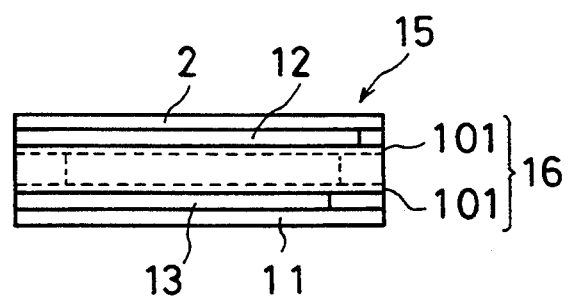
FIG. 6 is a front view when dielectric sheets are laminated.
Figure 7:
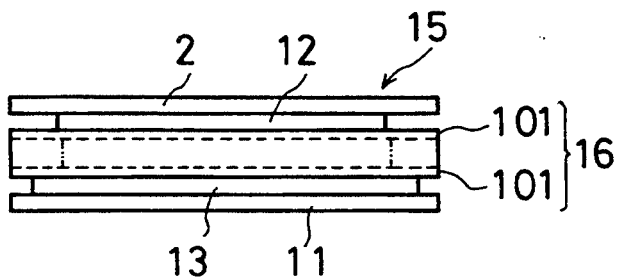
FIG. 7 is a side view when dielectric sheets are laminated.
Figure 8:
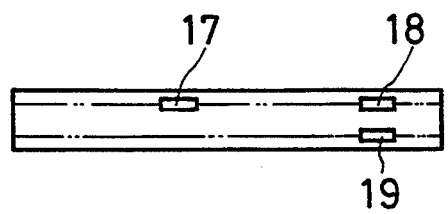
FIG. 8 is a front view when a laminate is pressed.
Figure 9:
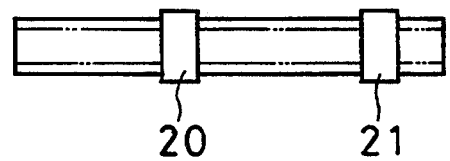
FIG. 9 is a front view when external electrodes are formed.
Figure 10:
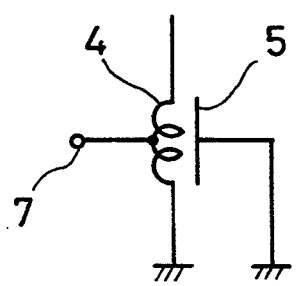
FIG. 10 is an equivalent circuit diagram of the dielectric resonator shown in FIG. 1.
Figure 11:
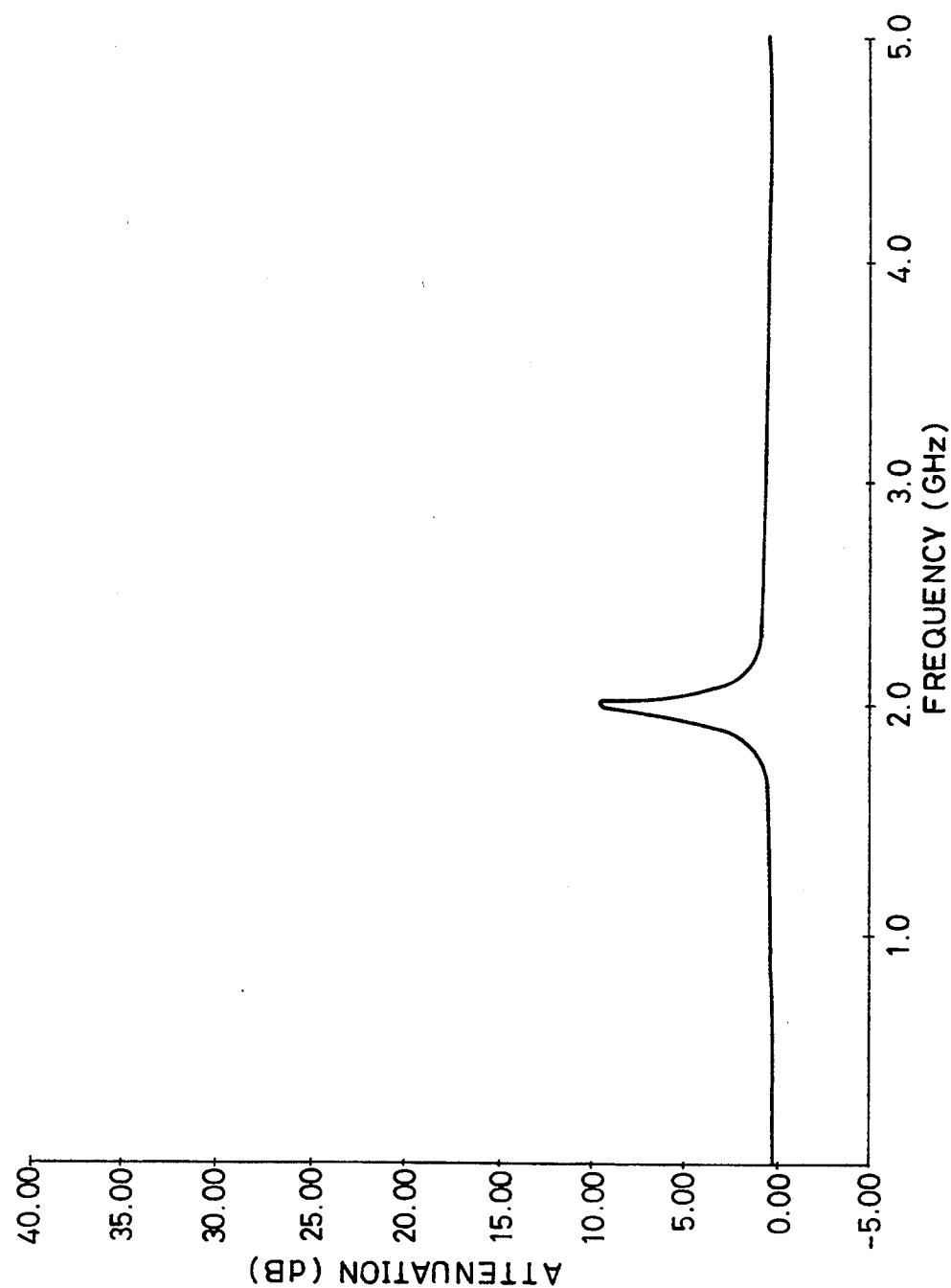
FIG. 11 is a graph showing frequency characteristics of the dielectric resonator shown in FIG. 1.
Figure 12:
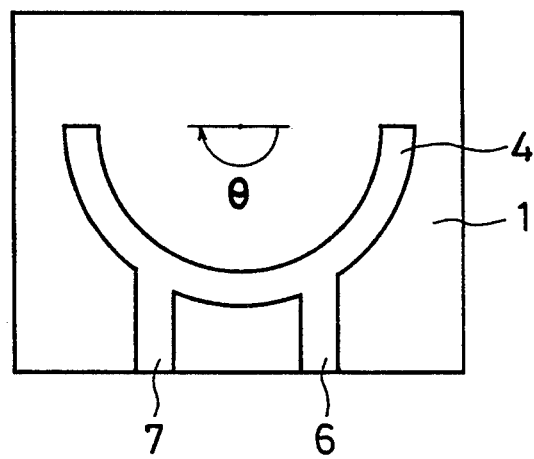
FIG. 12 is a plan view of essential portions showing a modified example of the dielectric resonator shown in the first example.
Figure 13:
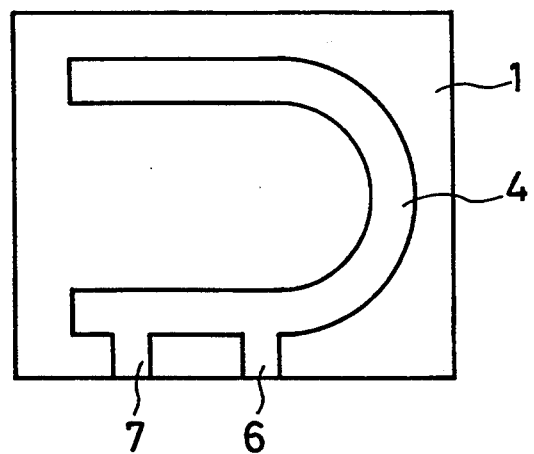
FIG. 13 is a plan view of essential portions showing an another modified example of the dielectric resonator shown in the first example.

A first example of the present invention is described in the following with reference to FIG. 1 through FIG. 13. FIG. 1 and FIG. 2 are views showing a construction of a dielectric resonator according to the first example of the present invention, wherein FIG. 1 is a plan view and FIG. 2 is an exploded perspective view, FIG. 3 is a plan view of a dielectric sheet used in the present invention, FIG. 4 is a plan view showing a state where a coil electrode pattern is formed on the dielectric sheet of FIG. 3, FIG. 5 is a plan view showing a state where an earth electrode pattern is formed on the dielectric sheet of FIG. 3, FIG. 6 and FIG. 7 are views when the dielectric sheets are laminated, wherein FIG. 6 is a front view and FIG. 7 is a side view, FIG. 8 is a front view when a laminate is pressed, FIG. 9 is a front view when external electrodes are formed, FIG. 10 is an equivalent circuit diagram of a dielectric resonator, FIG. 11 is a graph showing frequency characteristics of the dielectric resonator, and FIG. 12 and FIG. 13 are plan views of essential portions showing modified examples.

As shown in FIG. 1 and FIG. 2, the dielectric resonator of the present invention comprises, a dielectric layer 1 consisting of plural dielectric sheets 101 . . . and protective layers 2, 3 provided on upper and lower sides of the dielectric layer 1.

On one surface 101a of the dielectric sheet 101 which is on the top of the dielectric sheets 101 . . . , U-shaped coil electrode pattern (first electrode) 4 is formed. These are fired and integrated with one another. A specific construction of the coil electrode pattern is such that, pattern pieces 4a and 4b which are both linear and disposed on the opposite sides are connected via a linear pattern piece 4c which is connected to one end of the pattern pieces 4a and 4b (that is, a loop shape). It is constructed such that a total length $L_3$ of the coil electrode pattern 4 becomes the length shown in Equation 3, and to the pattern piece 4a an earth terminal pattern 6 and an input/output terminal pattern 7 whose end portions are extended to a side face A of the dielectric resonator are connected.

$$L_3 \approx \frac{1}{4} \lambda \times \frac{1}{\sqrt{\epsilon}} \qquad \text{Equation 3}$$

where, $\lambda$: wavelength, $\epsilon$: dielectric constant

On a face 3a of the protective layer 3 on the side of the dielectric layer 1, an earth electrode pattern (second electrode) 5 is formed, and constructed substantially throughout the surface 3a such that the size of the earth electrode pattern 5 becomes larger than a periphery of the coil electrode pattern 4. Also, at a position on the surface 3a corresponding to the earth terminal pattern 6, an earth terminal pattern (another earth terminal) 8 whose one end is connected to the earth electrode pattern 5 and the other end thereof is extended to the side face A of the dielectric resonator is formed. And, the earth terminal pattern 6 and the earth terminal pattern 8 are connected to an external earth electrode 9 which is formed oh the side face of the resonator and has a U-shaped cross section, and the input/output terminal pattern 7 is connected to an external input/output electrode 10 which is formed on the side face of the resonator and has a U-shaped cross section.

The dielectric resonator having the above-mentioned construction was produced by the following procedures.

First, on one surface of the dielectric sheet 101 (thickness of several tens of $\mu$m) shown in FIG. 3, a copper paste or the like is coated so as to form a pattern 12 (same pattern as the coil electrode pattern 4 and terminal patterns 6, 7) as shown in FIG. 4. While, in parallel thereto, on one surface of a protective sheet 11 having a same configuration as the dielectric sheet 101 (however, a thickness may be different), the copper paste or the like is coated so as to form a pattern 13 (same pattern as the earth electrode pattern 5 and the earth terminal pattern 8) as shown in FIG. 5.

Next, as shown in FIG. 6 and FIG. 7, a protective sheet 2, a sheet layer 16 and the protective sheet 11 (same construction as the protective sheet 2) are laminated, such that the pattern 12 and the pattern 13 are disposed on the opposite sides via the sheet layer 16 consisting of the dielectric sheets 101, and further, are pressed to produce a laminate 15. Hereinafter, at locations (the locations which serve as the external earth electrode 9 and the external input/output electrode 10) corresponding to exposed portions 17, 18 and 19 of a paste layer shown in FIG. 8, the copper paste or the like is printed or coated to produce paste layers 20, 21 as shown in FIG. 9. Then, the dielectric sheets are integrated by firing the laminate, whereby the dielectric resonator is produced. Here, the laminate may be fired by a process separate from firing of the paste layers 20, 21.

Now, though no capacitor pattern is formed on the dielectric resonator which is produced in the above-mentioned manner, it has an equivalent circuit as shown in FIG. 10. This is due to two reasons shown in the following.

1. The coil electrode pattern 4 is in the same potential (that is, in the earthed state) as the earth electrode pattern 5.

2. Since the dielectric layer 1 is interposed between the coil electrode pattern 4 and the earth electrode pattern 5, a floating capacitance is produced.

The above-mentioned floating capacitance is produced not only between the coil electrode pattern 4 and the earth electrode pattern 5, but also between the pattern pieces 4a and 4b of the coil electrode pattern 4. However, it is mainly produced between the coil electrode pattern 4 and the earth electrode pattern 5. Thus, by bringing the two patterns 4 and 5 closer or further apart from one another, the floating capacitance changes and it is possible to change the resonance frequency. Specifically, when the two patterns 4, 5 are brought close one another (reducing the thickness of the dielectric sheets 101), the resonance frequency becomes lower because the capacitance of the capacitor increases, while when the two patterns 4, 5 are moved apart from one another (increasing the thickness of the dielectric sheets 101), the resonance frequency becomes higher because the capacitance of the capacitor decreases. It is also possible to change the floating capacitance by changing the dielectric constant of the dielectric layer 1 or the size of the coil electrode pattern 4. For example, when a width $L_7$ of the coil electrode pattern 4 is broadened, it can be minimized because the floating capacitance becomes larger and the resonance frequency can be lowered. However, it is not desirable to increase the width $L_7$ of the coil electrode pattern 4 unnecessarily, because the waveform is deteriorated when a distance between the pattern pieces 4a and 4b is made too narrow.

Furthermore, in the above-mentioned dielectric resonator, the impedance can be adjusted to any value by changing a distance $L_4$ between the earth terminal pattern 6 and the take-out terminal pattern 7.

According to the experiment, it was possible to adjust applicable frequencies of the resonator of the present invention in the range of several hundreds MHz to several GHz, by adjusting the dielectric constant and thickness of the dielectric layer 1, or an area of the coil electrode pattern 4. An example thereof is shown in the following experiment.

(Experiment)

Frequency characteristics of a dielectric resonator having the above-mentioned construction were examined, and the result is shown in FIG. 11.

As is obvious from FIG. 11, the above-mentioned dielectric resonator has a peak of resonance point at 2 GHz, and its increment and decrement show a very sharp characteristic. In addition, they are flat in the other frequency regions. From this result, it is observed that the Q is remarkably improved.

This is believed to be due to two reasons shown in the following.

1. Reason that it is a strip-line construction:

The dielectric resonator has a so-called strip-line construction, in which the coil electrode pattern 4 and the earth electrode pattern 5 are opposing to each other.

2. Reason that pattern pieces of the coil electrode pattern 4 are not adjacent to each other like the spiral-shaped coil pattern:

The coil electrode pattern 4 of the dielectric resonator has a U-shape, thus magnetic fluxes do not influence each other between the adjoining coil electrode patterns 4 to disturb an electric current flow. Thus, a substantial increase in resistance is restrained and the Q becomes higher.

(Other respects)

1. The shape of the coil electrode pattern 4 is not limited to those shown in the above-mentioned example, but it will do as long as it has a loop-shape. For example, it may be of a circular shape as shown in FIG. 12, or a U-shape as shown in FIG. 13. However, in the coil electrode pattern 4 shown in FIG. 12, an angle $\theta$ must be within the range of $\pi \leq \theta \leq 2\pi$.

2. When installing the resonator of the present invention, it may be installed and soldered while the external earth electrode 9 and external take-out electrode 10 are positioned on a printed circuit board. At this time, since the outsides are covered with the protective layers 2 and 3, the coil electrode pattern 4 and the earth electrode pattern 5 are protected from damage.

3. As for the dielectric layer 1, it is not limited to the construction where several thin dielectric sheets 101 are laminated, but rather a dielectric sheet which is formed into a predetermined thickness beforehand may be used as well.

4. The resonator of the present invention need not be produced one by one, but rather it may be produced by a process wherein plural coil electrode patterns 4 are formed on a broad dielectric sheet, or the same number of earth electrode patterns 5 are formed on the similar dielectric sheet, and after laminating in that state cut apart one by one for baking.

(Second Example)

Figure 14:
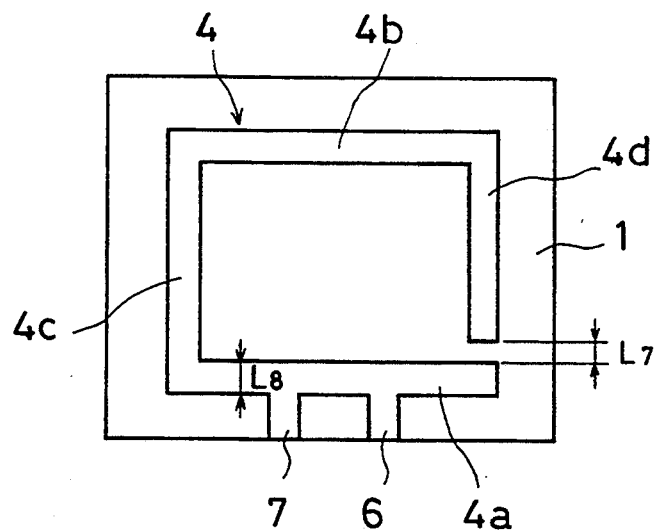
FIG. 14 is a plan view of essential portions of a dielectric resonator according to a second example of the present invention.
Figure 15:
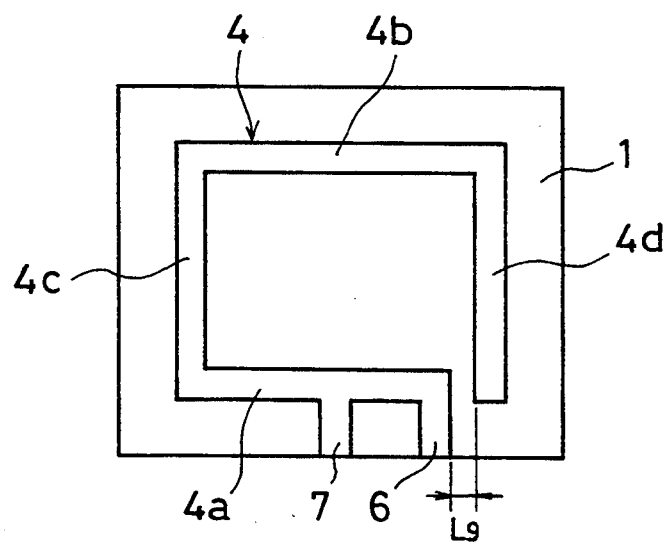
FIG. 15 is a plan view of essential portions showing a modified example of the dielectric resonator shown in the second example.
Figure 16:
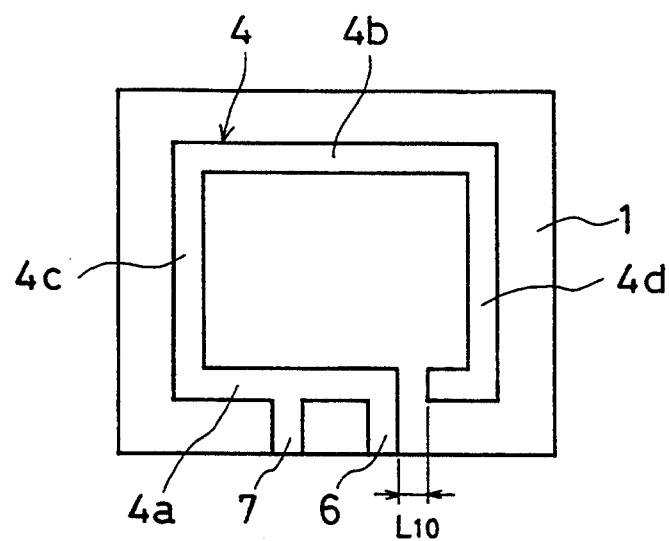
FIG. 16 is a plan view of essential portions showing an another modified example of the dielectric resonator shown in the second example.
Figure 17:
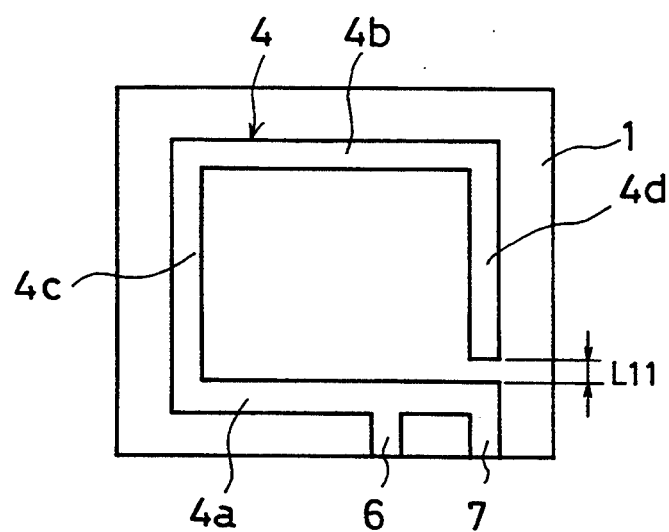
FIG. 17 is a plan view of essential portions showing a still further modified example of the dielectric resonator shown in the second example.
Figure 18:
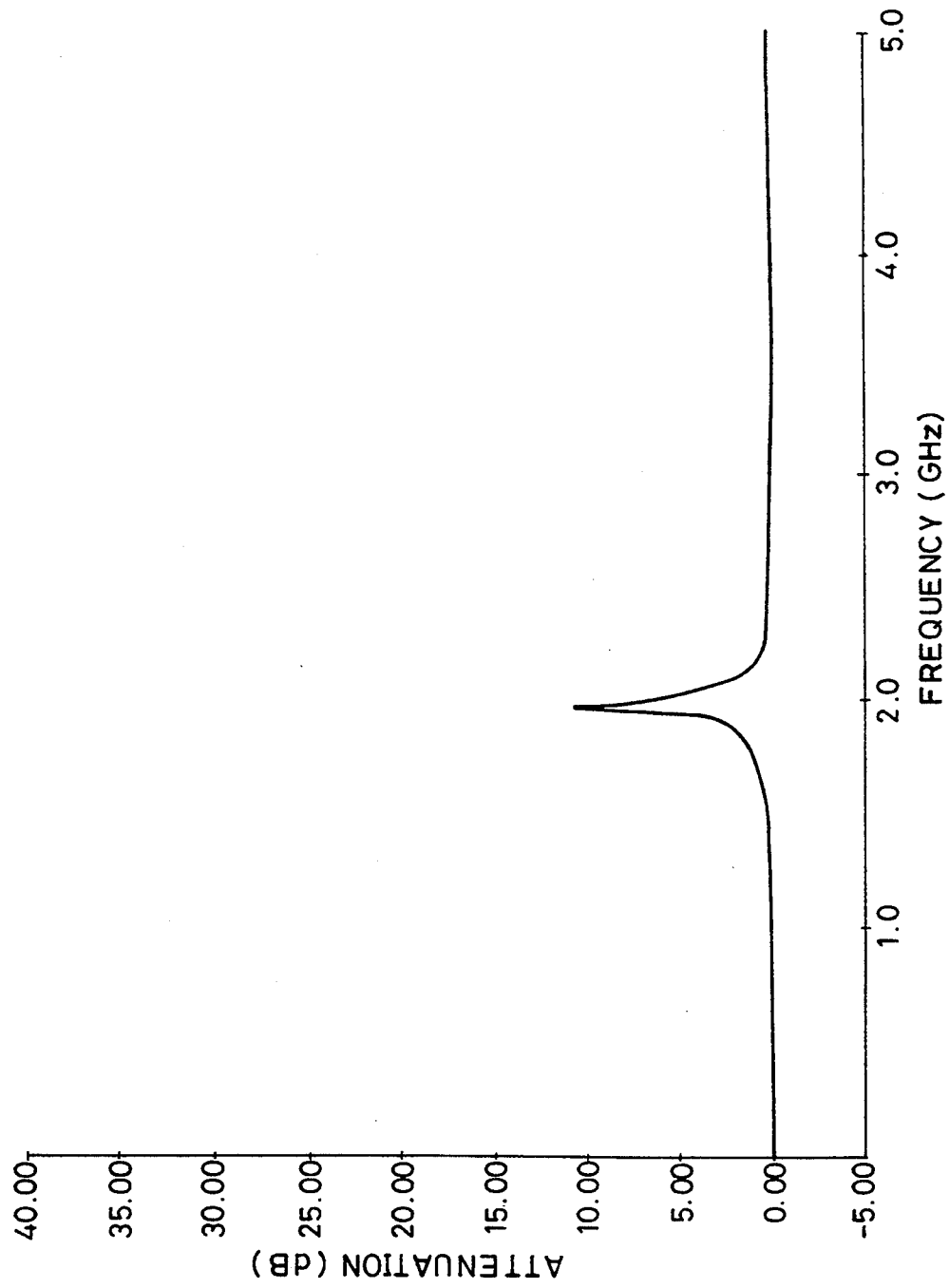
FIG. 18 is a graph showing frequency characteristics of the dielectric resonator shown in FIG. 14.

A second example of the present invention is described in the following with reference to FIG. 14 through FIG. 18. FIG. 14 is a plan view of essential portions of a dielectric resonator according to the second example of the present invention, FIG. 15 through FIG. 17 are plan views of essential portions of modified examples and FIG. 18 is a graph showing frequency characteristics of the dielectric resonator shown in FIG. 14. Parts having the same function as in the first example are designated by the same reference numerals and their descriptions are omitted. This applies also to the following examples.

As shown in FIG. 14, the second example has the same configuration as the first example, except that a shape of the coil electrode pattern 4 and a connecting position of the earth terminal pattern 6 and the input-/output terminal pattern 7 are somewhat different. A specific shape of the coil electrode pattern 4 is so constructed (that is, a loop-shape) that an open end of the pattern piece 4b is extended toward the pattern piece 4a so as to be parallel with the pattern piece 4c to form a pattern piece 4d. A distance $L_7$ between the pattern piece 4d and the pattern piece 4a is preferably same as or less than a width $L_8$ of the pattern pieces 4a to 4d.

(Experiment)

Frequency characteristics of the dielectric resonator having the above-mentioned construction was examined, and the result is shown in FIG. 18.

As is obvious from FIG. 18, the above-mentioned dielectric resonator has a peak resonance point at 2 GHz and its increment and decrement show sharper characteristics, and they are flat in the other frequency regions. From this result, it is observed that the Q is remarkably improved. In addition, as compared with that of the first example, in the above-mentioned dielectric resonator the peak attenuation factor becomes much higher.

This is believed to be due to the reason that leakage of magnetic flux can be reduced, because the distance $L_7$ between the pattern piece 4d and the pattern piece 4a is very narrow and substantially forming a closed magnetic circuit.

(Other respects)

The construction of the coil electrode pattern 4, is not limited to the above-mentioned construction, but it may be a loop-shape such as the constructions shown in FIG. 15 through FIG. 17. Specifically, it may be the construction as shown in FIG. 15 in which the pattern piece 4a is shortened and the pattern piece 4d is further extended, or the construction as shown in FIG. 16 in which the pattern piece 4a is further shortened and the pattern piece 4d is extended furthermore, or the construction as shown in FIG. 17 in which the earth terminal pattern 6 and the input/output terminal pattern 7 are disposed reversely.

Also in these cases, distances $L_9$, $L_{10}$ and $L_{11}$ between the pattern pieces are preferably the same as or less than the width $L_8$ of the pattern pieces 4a, 4b, 4c and 4d. Further, in this case it has been confirmed by the experiment that, the frequency characteristic of the dielectric resonator is substantially equal to that of the aforementioned construction.

(Third Example)

Figure 19:
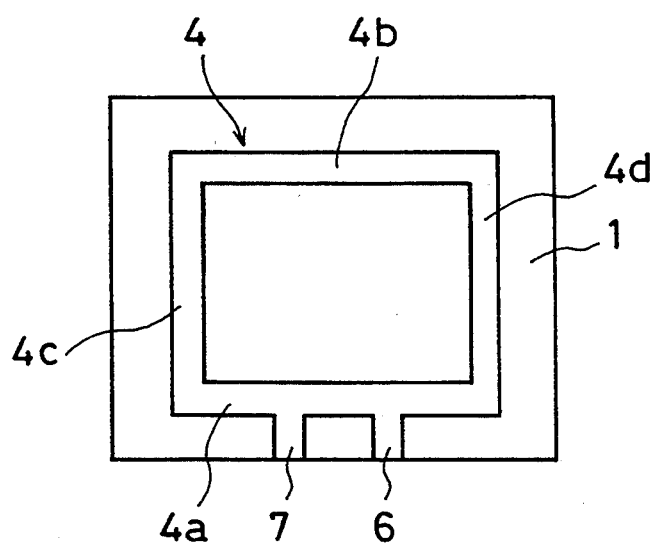
FIG. 19 is a plan view of essential portions of a dielectric resonator according to a third example of the present invention.

A third example of the present invention is described in the following with reference to FIG. 19 and FIG. 20. FIG. 19 is a plan view of essential portions of a dielectric resonator according to the third example of the present invention, and FIG. 20 is a graph showing frequency characteristics of the dielectric resonator shown in FIG. 19.

As shown in FIG. 19, the third example has the same configuration as the dielectric resonator shown in FIG. 14 of the second example, except that an end portion of the pattern piece 4d is connected to an end portion of the pattern piece 4a.

(Experiment)

Figure 20:
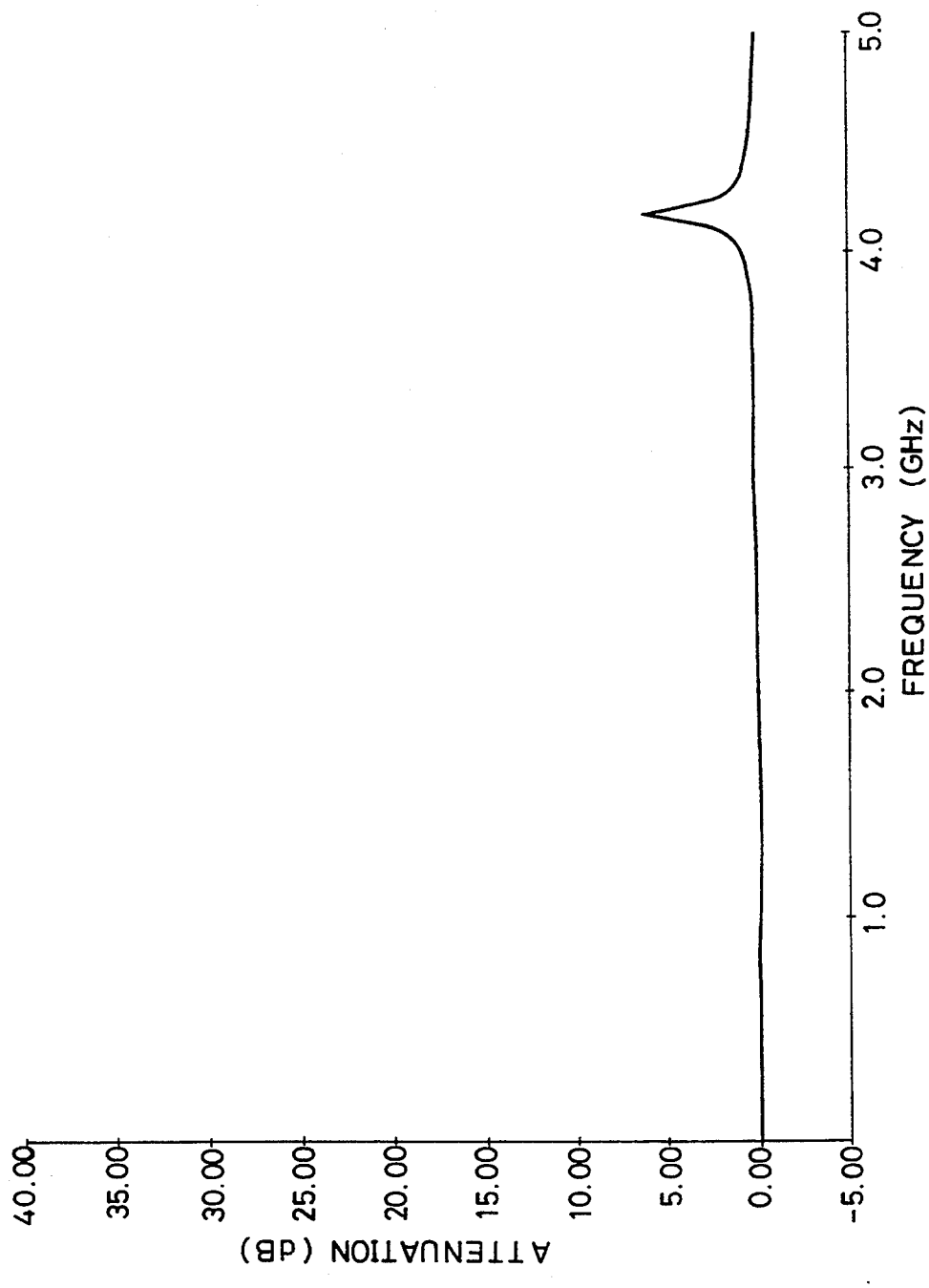
FIG. 20 is a graph showing frequency characteristics of the dielectric resonator shown in FIG. 19.

Frequency characteristics of the dielectric resonator having the above-mentioned construction were examined, and the result is shown in FIG. 20.

As is obvious from FIG. 20, the above-mentioned dielectric resonator has a peak resonance point at about 4 GHz and its increment and decrement show a sharp characteristic, and they are flat in the other frequency regions. From this result, it is observed that the Q remarkably improved.

The reason why the Q is improved is the same as in the above-mentioned example. Also, the reason for having a peak resonance point at 4 GHz is believed to be due to the enhancement of the strip-line character of the device, caused by connecting the end portion of the pattern piece 4d to the end portion of the pattern piece 4a.

(Fourth Example)

A fourth example of the present invention is described in the following with reference to FIG. 21 through FIG. 26. FIG. 21, FIG. 23 and FIG. 25 are exploded perspective views of dielectric resonators according to the fourth example of the present invention, and FIG. 22, FIG. 24 and FIG. 26 are graphs respectively showing frequency characteristics of the dielectric resonators shown in FIG. 21, FIG. 23 and FIG. 25.

As shown in FIG. 21, FIG. 23 and FIG. 25, they respectively have the same construction as the first example to the third example, except that the dielectric layer 1 and the earth electrode pattern 5 are disposed in order not merely opposite one surface of the coil electrode pattern 4 but rather opposite both surfaces thereof.

(Experiment)

Figure 22:
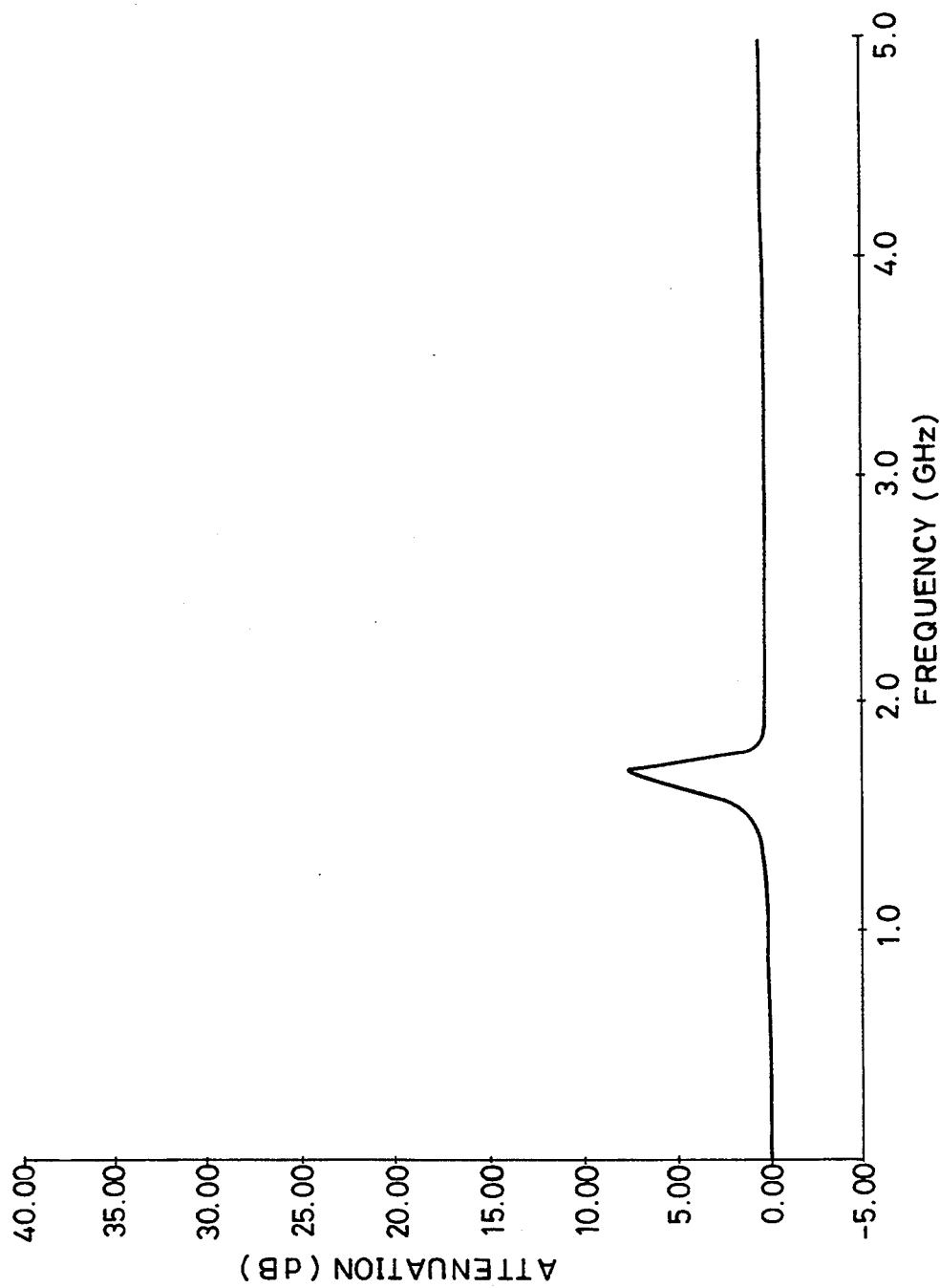
FIG. 22 is a graph showing frequency characteristics of the dielectric resonator shown in FIG. 21.
Figure 23:
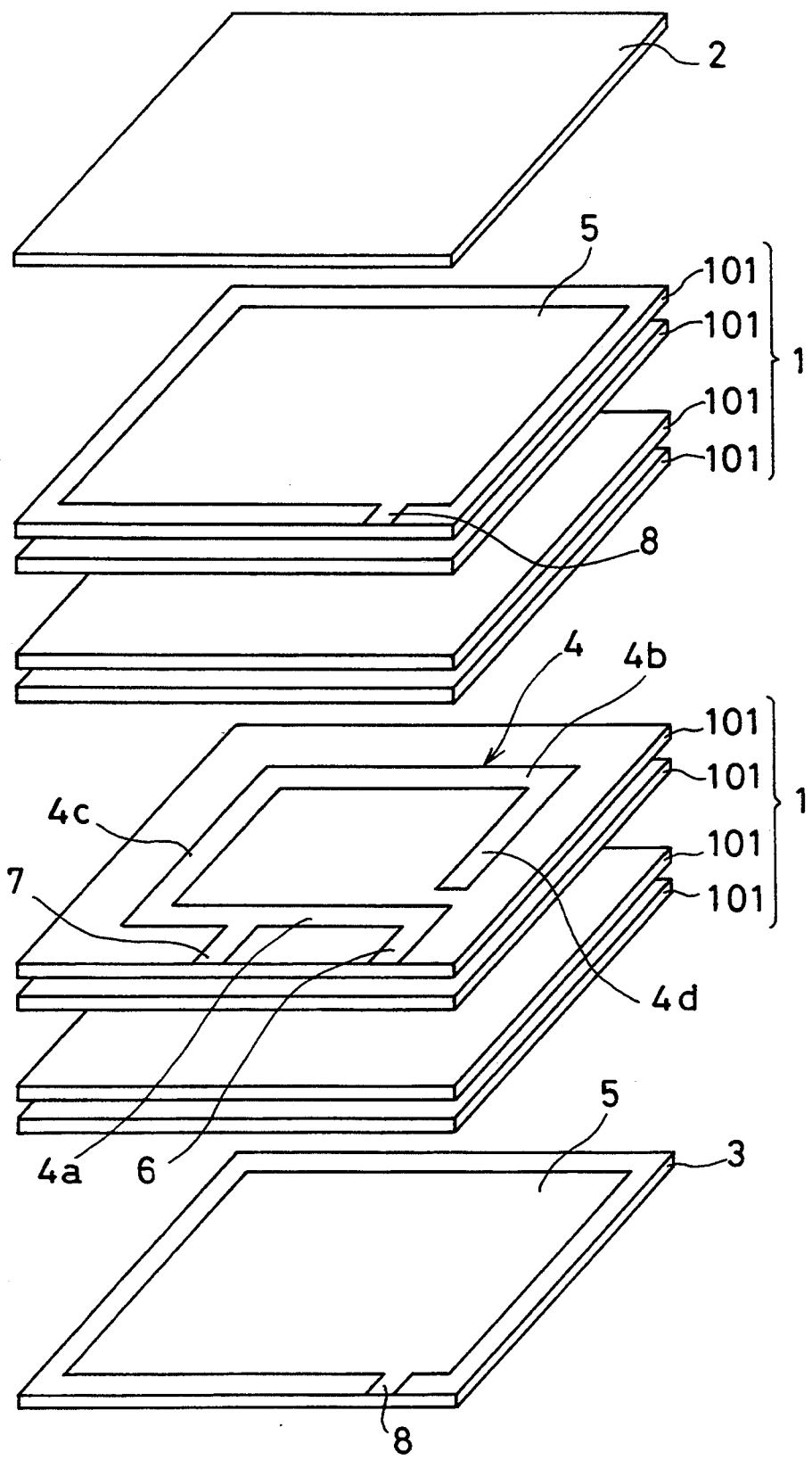
FIG. 23 is an exploded perspective view of the dielectric resonator according to a modification of the fourth example of the present invention.
Figure 24:
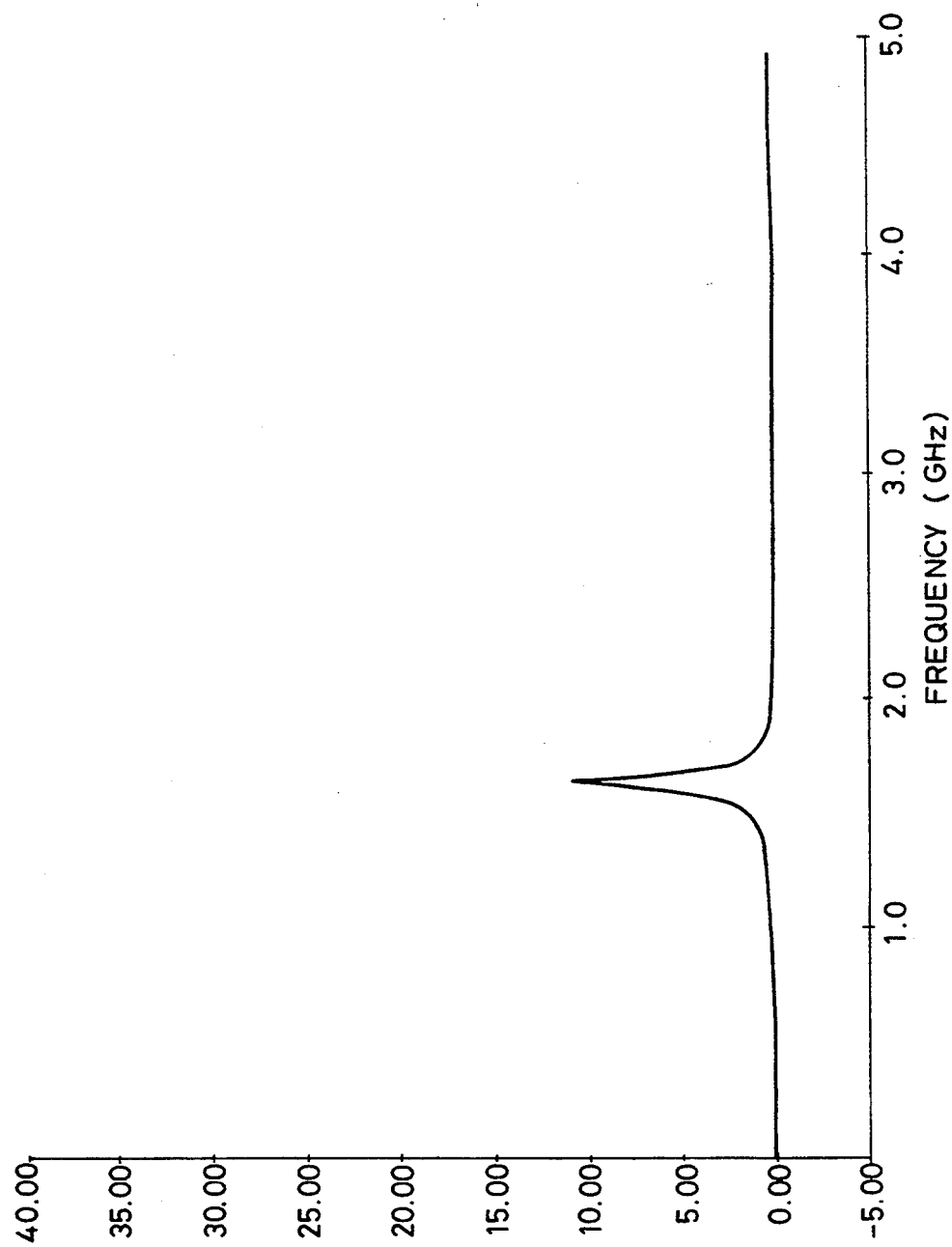
FIG. 24 is a graph showing frequency characteristics of the dielectric resonator shown in FIG. 23.
Figure 25:
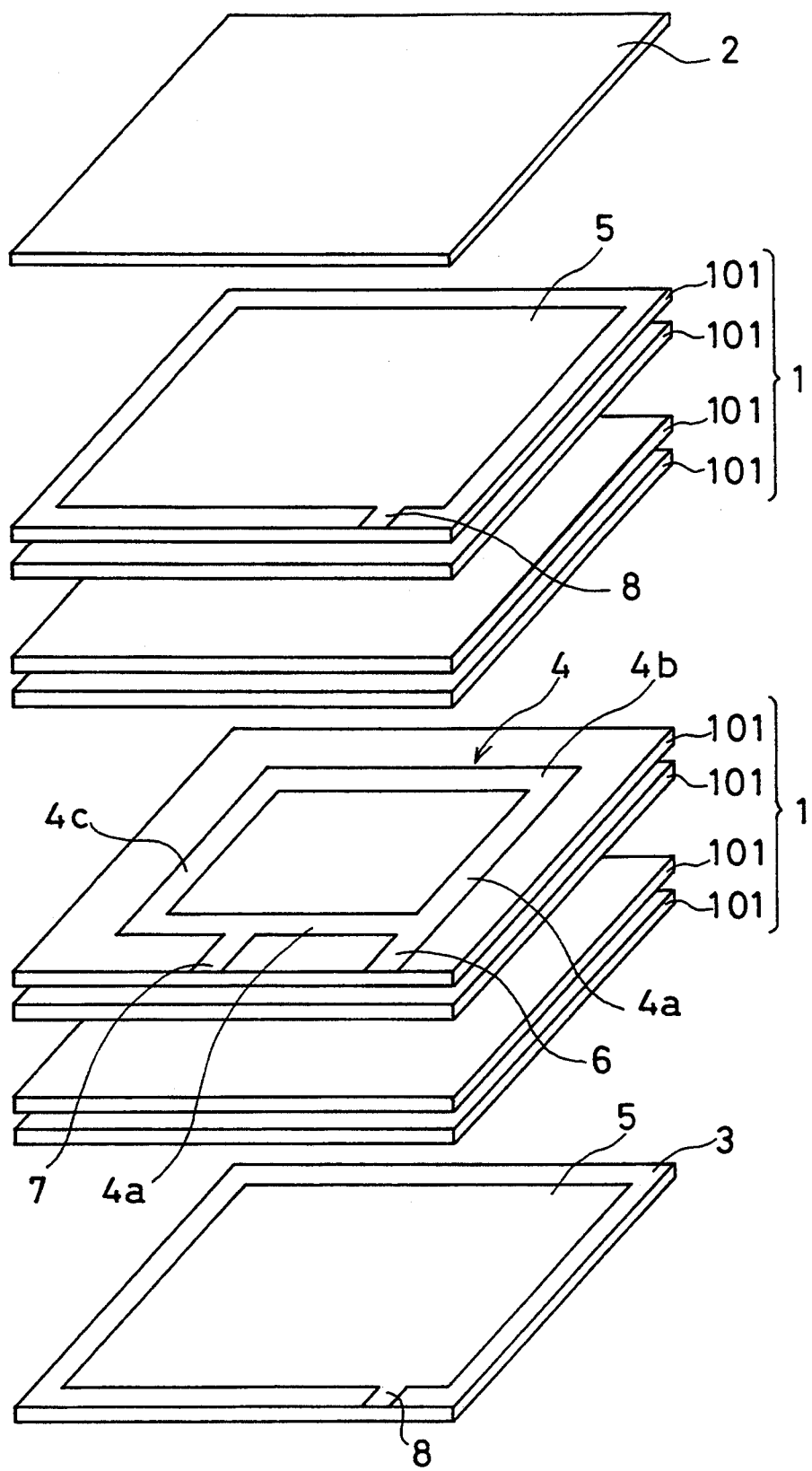
FIG. 25 is an exploded perspective view of the dielectric resonator according to another modification of the fourth example of the present invention.
Figure 26:
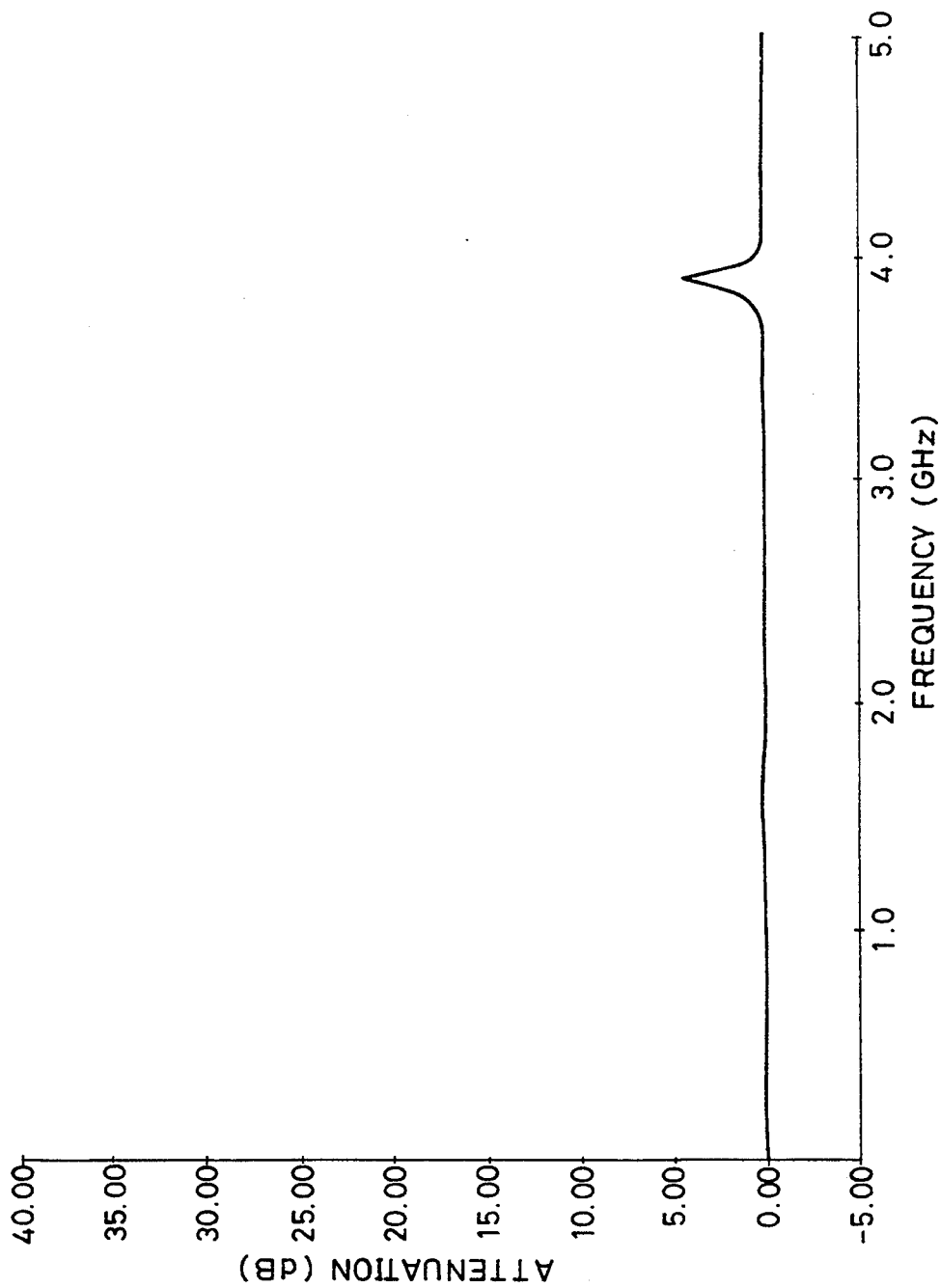
FIG. 26 is a graph showing frequency characteristics of the dielectric resonator shown in FIG. 25.

Frequency characteristics of the dielectric resonators having the above-mentioned construction were examined, and the results are shown in FIG. 22, FIG. 24 and FIG. 26.

As is obvious from FIG. 22, FIG. 24 and FIG. 26, in the above-mentioned dielectric resonators, as in the first example to the third example, the increment and decrement of the peak of attenuation factor show sharp characteristics, and they are flat in the other frequency regions. However, it is observed that the frequency peak is somewhat low.

This is believed to be due to increase in the floating capacitance, because the floating capacitance is formed not only on one side but rather on both sides of the coil electrode pattern 4.

(Fifth Example)

Figure 27:
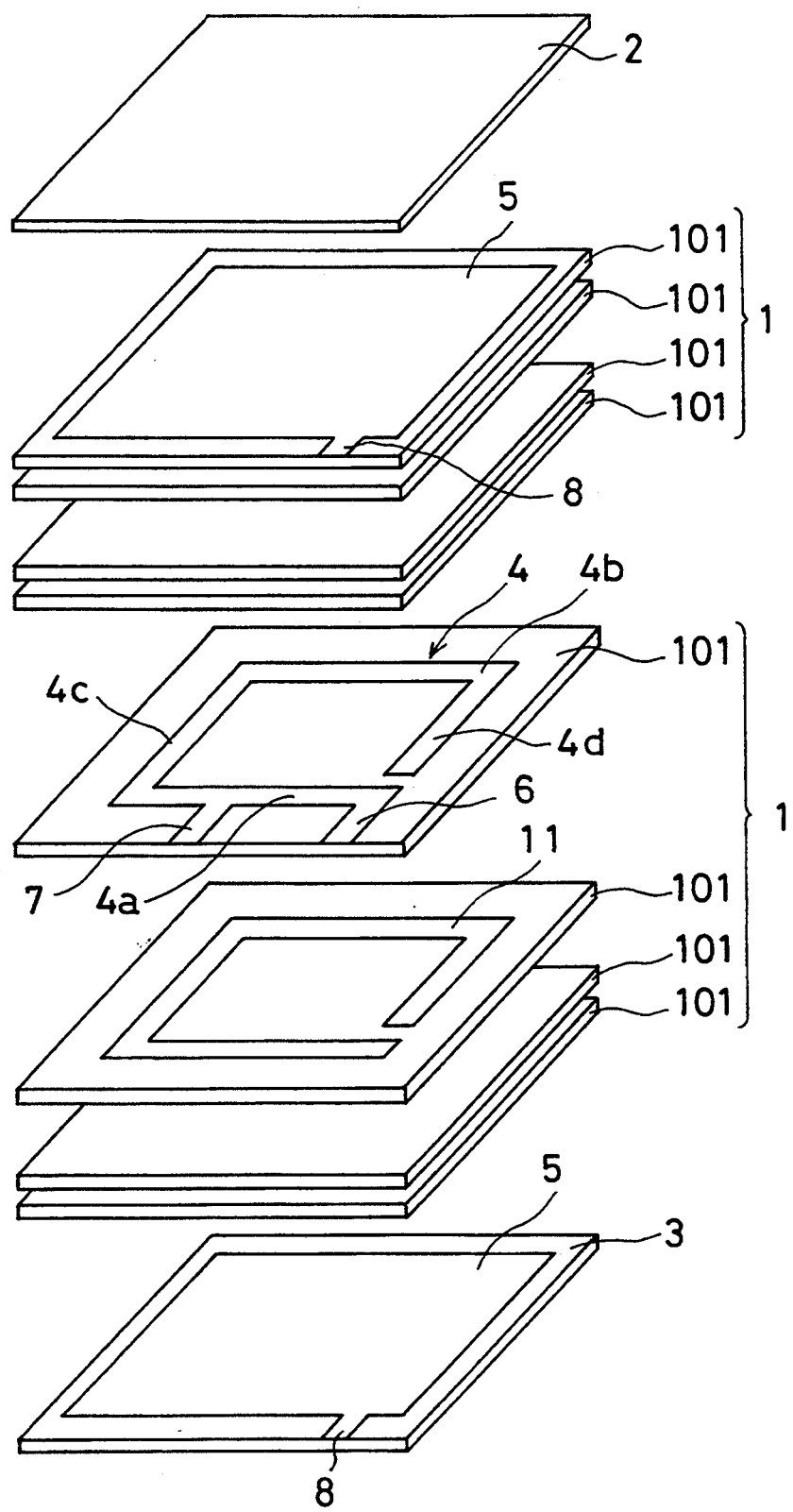
FIG. 27 is an exploded perspective view of a dielectric resonator according to a fifth example of the present invention.

A fifth example of the present invention is described in the following with reference to FIG. 27. FIG. 27 is an exploded perspective view of a dielectric resonator according to the fifth example of the present invention.

As shown in FIG. 27, it has a same configuration as the dielectric resonator shown in FIG. 23 of the fourth example, except that a floating electrode pattern (third electrode) 11 having the same shape as the coil electrode pattern 4 is formed on a dielectric sheet 101 adjacent to the dielectric sheet 101 whereon the coil electrode pattern 4 is formed.

Although not shown, it has been confirmed by an experiment that, a peak resonance point is much lower than that of the dielectric resonator shown in FIG. 23 of the fourth example, by having such a construction.

This is believed to be due to increase the floating capacitance of the dielectric resonator, because an additional floating capacitance is formed between the coil electrode pattern 4 and the floating electrode pattern 11.

Figure 38:
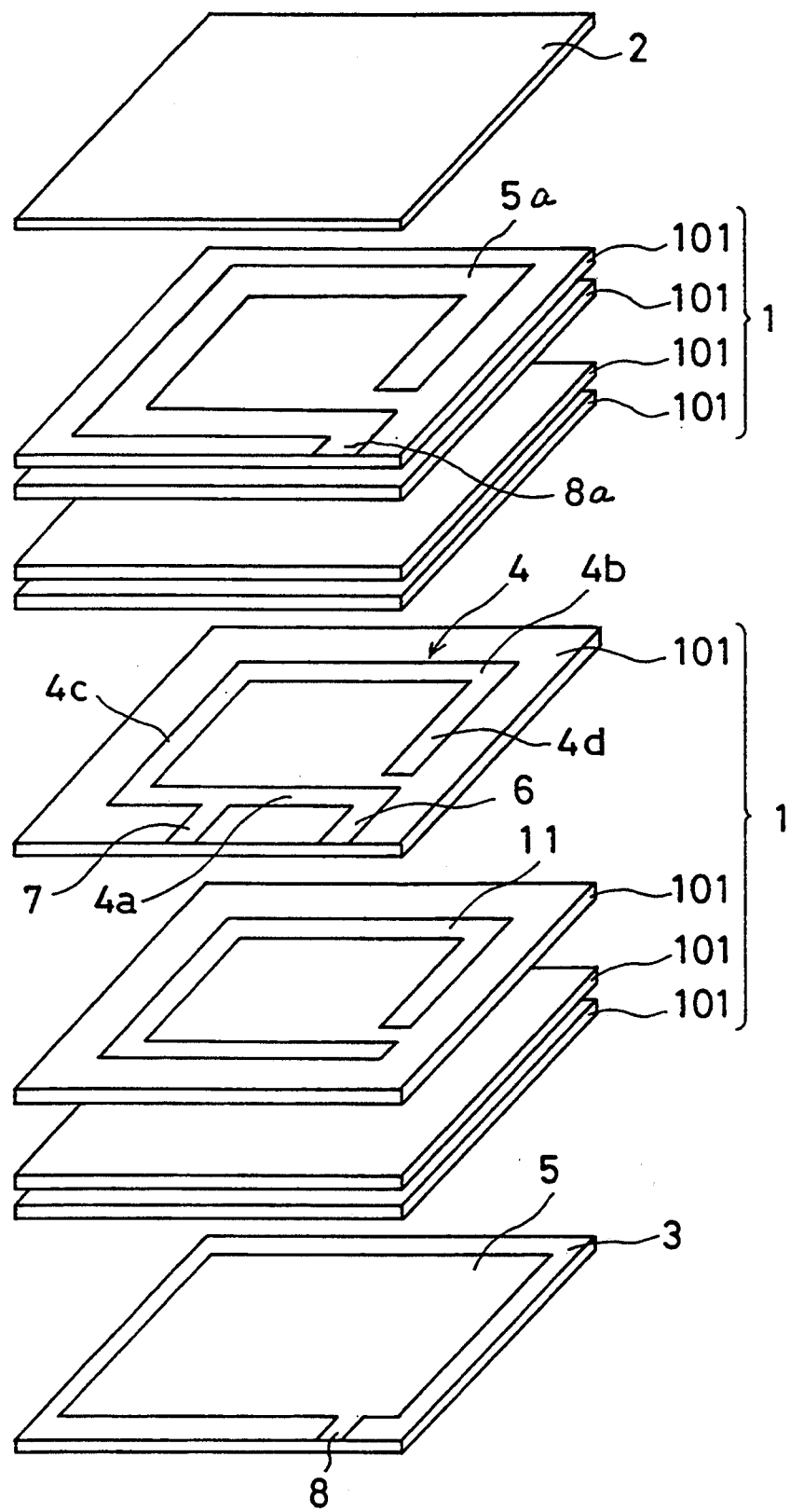
FIG. 38 is an exploded perspective view of a resonator according to an additional embodiment of the invention.

FIG. 38 shows a modification of the fifth example of the invention. In this modified example, the upper earth electrode pattern (second electrode) 5a, which is formed on the uppermost dielectric layer 1, as seen in FIG. 38, is modified to have a shape similar to that of an adjacent first electrode 4, but larger, in that the strip-shaped material of which the second electrode is formed has a greater width than the corresponding material strips of the first electrode 4. A respective second earth terminal 8a is formed so as to extend from the second electrode 5a, toward the front edge of the dielectric plate 1 on which the second electrode is formed. As in the other forms of the invention, it is advantageous for the earth terminals 6, 8a drawn out from corresponding first and second electrodes 4, 5a, to line up along a common edge of the dielectric plates 1 on which they are formed.

(Sixth Example)

A sixth example of the present invention is described in the following with reference to FIG. 28 and FIG. 29.

Figure 28:
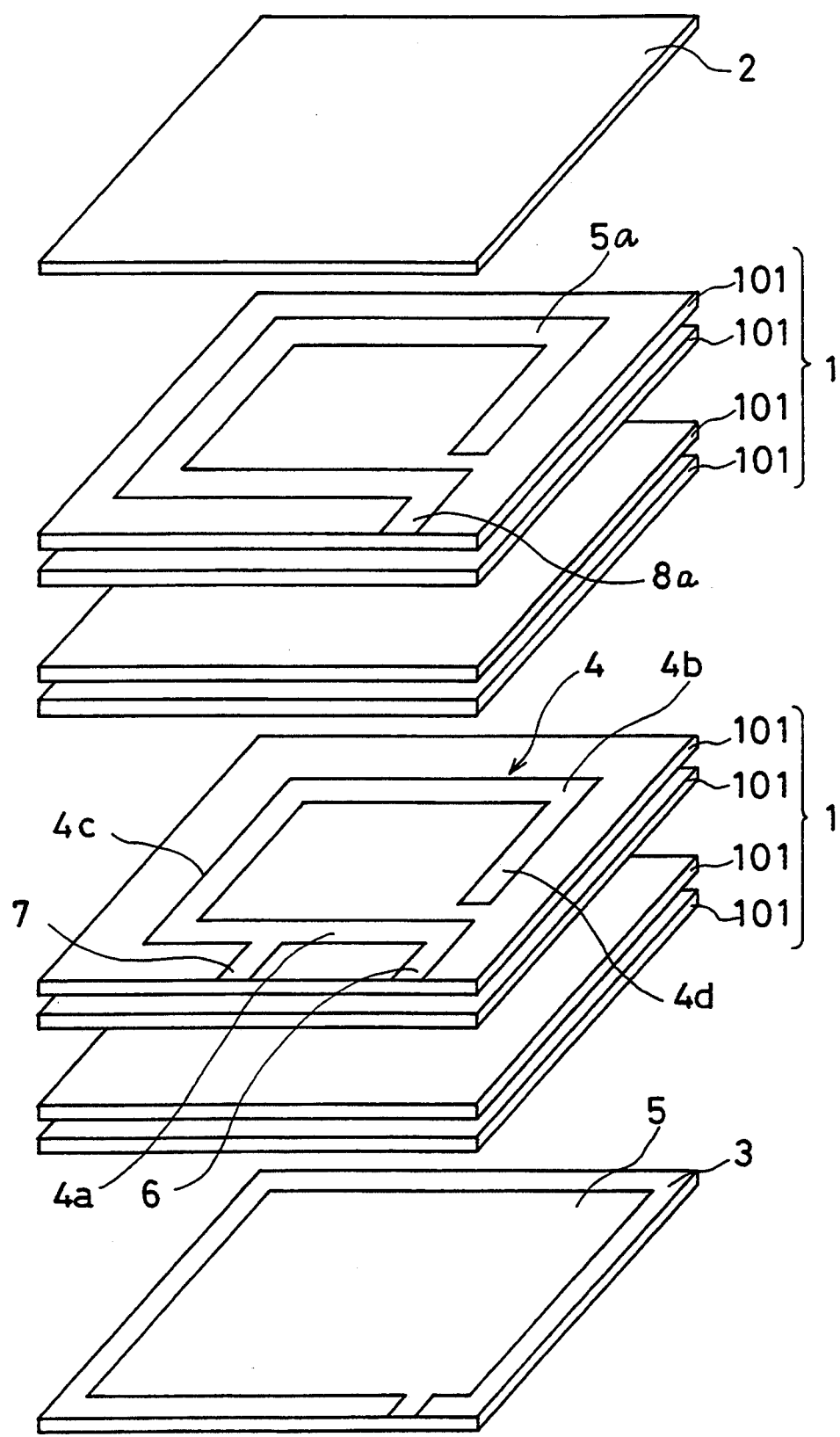
FIG. 28 is a perspective view of a dielectric resonator according to a sixth example of the present invention.
Figure 29:
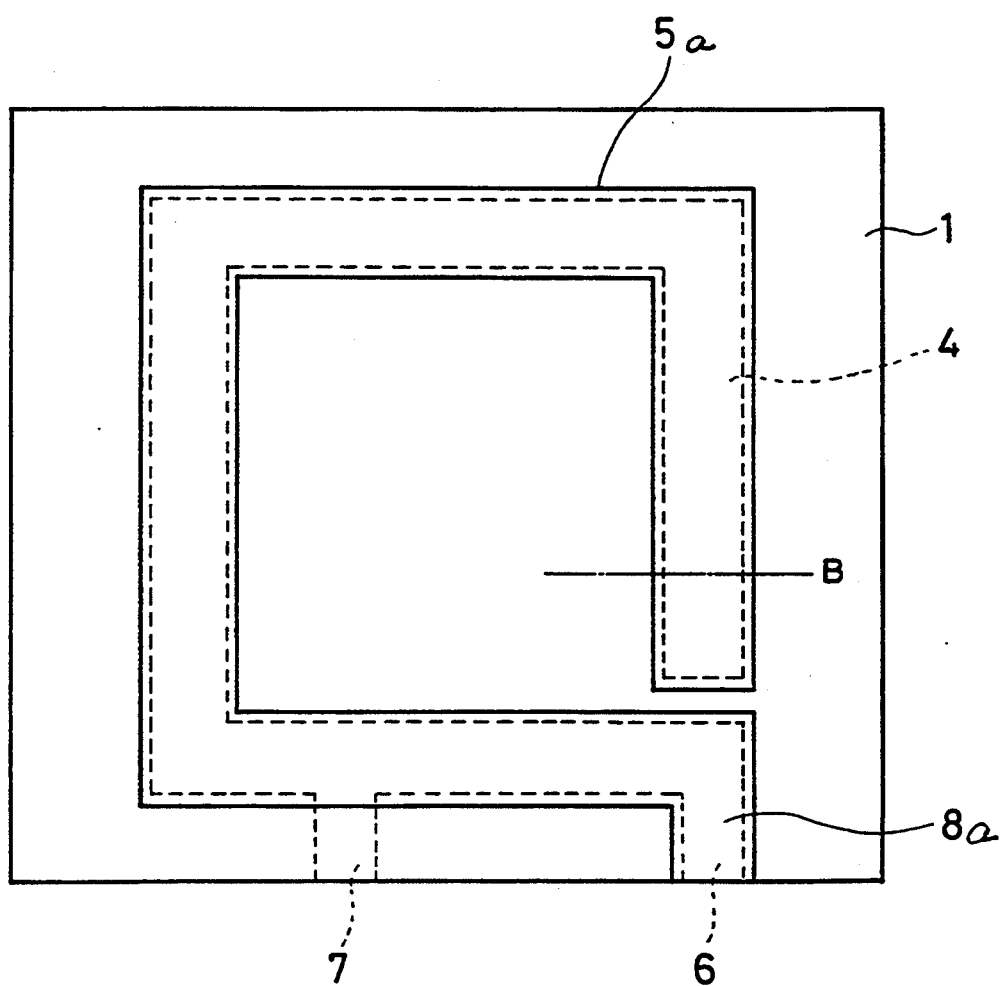
FIG. 29 is a plan view of the dielectric resonator according to the sixth example of the present invention.

FIG. 28 and FIG. 29 show a resonator according to the sixth example of the present invention, wherein FIG. 28 is an exploded perspective view and FIG. 29 is a plan view.

As shown in FIG. 28 and FIG. 29, it has the same configuration as the resonator shown in FIG. 23 of the fourth example, except that a shape of one earth electrode pattern (an upper pattern in FIG. 28) 5a is made different. Specifically, it is so constructed that the shape of the earth electrode pattern 5a corresponds to that of the coil electrode pattern 4, but has larger electrode pattern pieces. An earth terminal pattern 8a is connected to the earth electrode pattern 5a.

By such a configuration, it is possible to simply adjust the frequency, because the floating capacitance can be adjusted just by cutting a portion (e.g. the portion shown by one-dot chain line B in FIG. 29) of the earth electrode pattern 5a corresponding to the pattern piece 4d.

Though the above-mentioned adjustment is also possible for the earth electrode patterns (formed over almost the entire dielectric sheet) of the first example to the fifth example, when the frequency is to be adjusted, the configuration of this example is preferable because the required cut lengths of the earth electrode patterns of the first example to fifth example are long.

Moreover, the construction of the earth electrode pattern as in this example is not limited to use in the resonator having the construction shown in FIG. 23 of the fourth example, but is also applicable for those shown in the other examples.

(Seventh Example)

Figure 30:
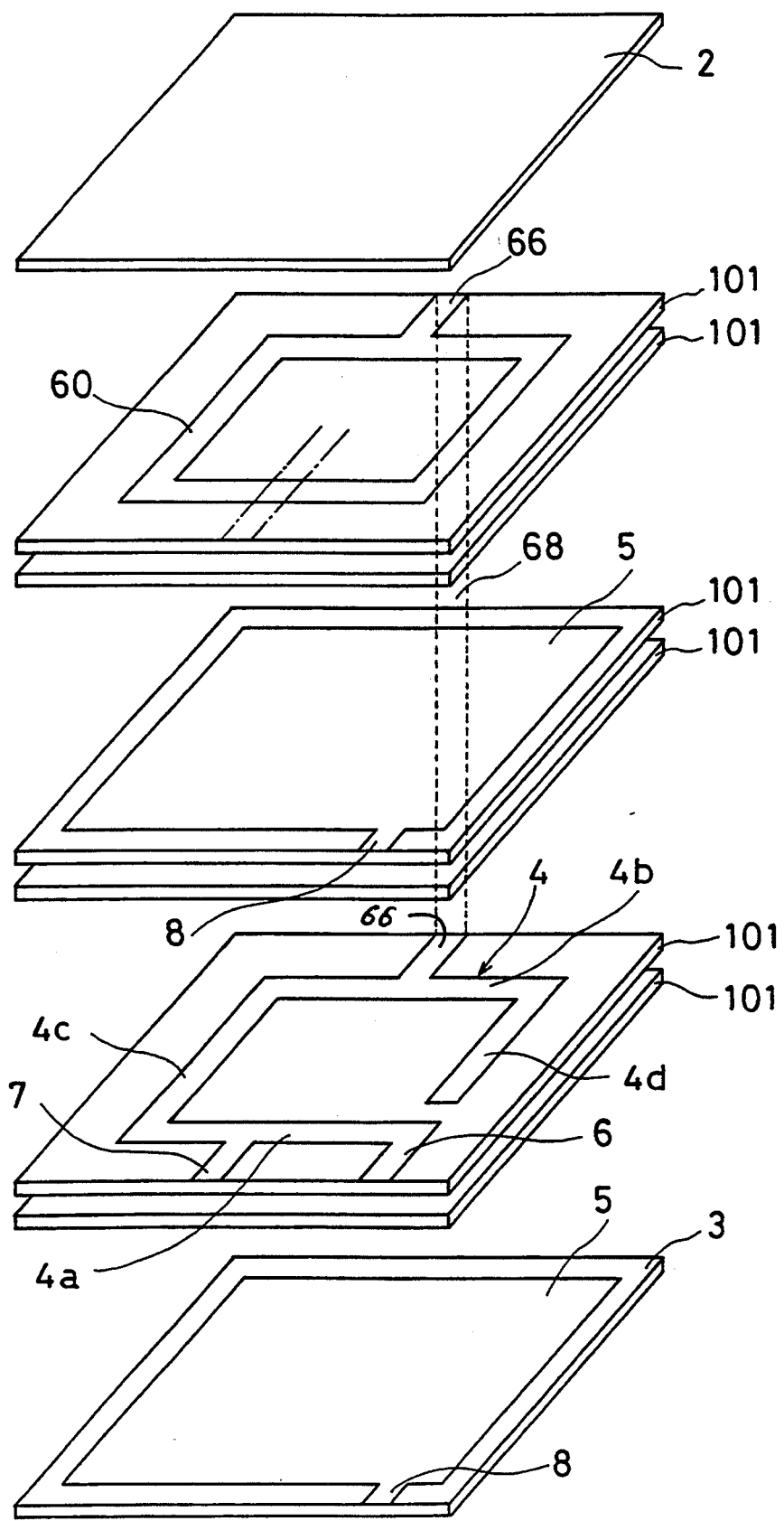
FIG. 30 is an exploded perspective view of a resonator according to a seventh example of the present invention.
Figure 34:
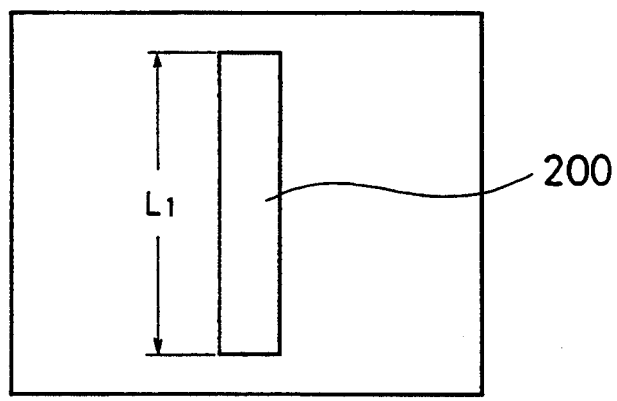
FIG. 34 is an explanatory view showing a conventional strip-line type dielectric resonator.
Figure 35:
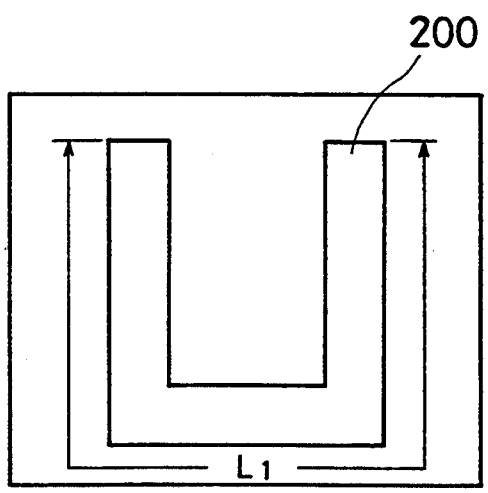
FIG. 35 is an explanatory view showing an another conventional strip-line type dielectric resonator.
Figure 36:
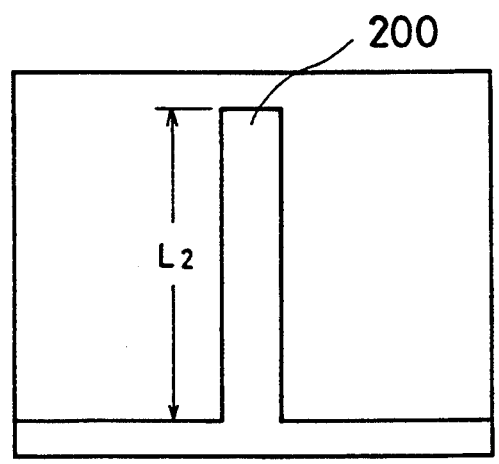
FIG. 36 is an explanatory view showing a still further conventional strip-line type dielectric resonator.
Figure 37:
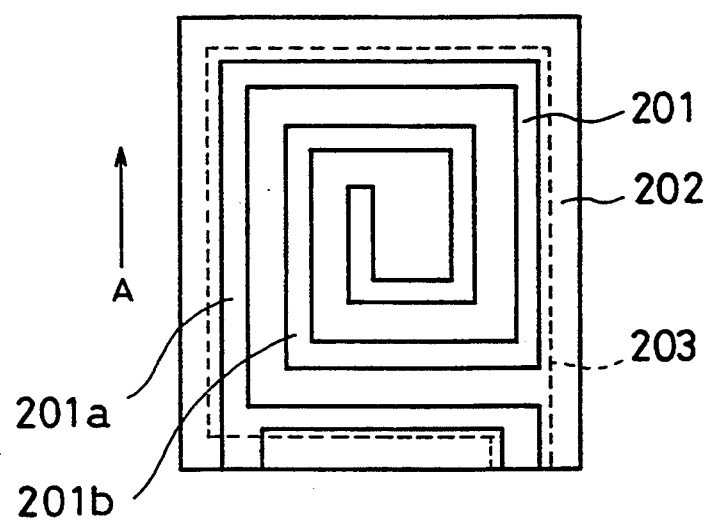
FIG. 37 is an explanatory view showing a conventional coil-pattern type dielectric resonator.

A seventh example of the present invention is described in the following with reference to FIG. 30. FIG. 30 is an exploded perspective view of a resonator according to the seventh example of the present invention.

In the resonator of the seventh example, a loop shaped trimming electrode 60 is formed between one earth electrode pattern (an upper pattern in FIG. 30) and the protective layer 2. The trimming electrode 60 is disposed on the opposite side of the upper earth electrode pattern from the coil electrode pattern 4, with the dielectric sheet 101 and the upper earth electrode pattern 5 between them. A connecting terminal pattern 66 is formed to the trimming electrode 60, and connected to another connecting terminal pattern 66 which is drawn out from the coil electrode pattern 4 toward a side of the dielectric sheet 101. The connecting terminal pattern 66 of the trimming electrode 60 is connected to the connecting terminal pattern 66 of the coil electrode pattern 4 via an external connecting electrode 68.

In the resonator of the seventh example, the floating capacitance between the trimming electrode 60 and the earth electrode pattern 5 is changed by trimming the trimming electrode 60 as shown by a one-dot chain line in FIG. 30, for example with a laser trimming method. And the resonance frequency of the resonator is thereby changed as well.

The shape of the trimming electrode 60 is not limited to the loop shape shown, but may also be a partial loop shape as shown in FIG. 31. In the case of using such shape, the floating capacitance is changed by trimming, and the resonance frequency of the resonator is thereby changed as well.

(Eighth Example)

A eighth example of the present invention is described in the following with reference to FIG. 32. FIG. 32 is an exploded perspective view of a resonator according to the eighth example of the present invention.

In the resonator of the eighth example, trimming electrode group 70 is formed within one earth electrode pattern (an upper pattern in FIG. 32). The trimming electrode group 70 includes band shaped trimming electrodes 70a, 70b, 70c. The trimming electrodes 70a, 70b, 70c are connected to the earth electrode pattern 5.

In the resonator of the eighth example, the magnetic field shield effect is reduced by cutting the trimming electrodes as shown in FIG. 33, for example with a laser trimming method. This matter equals to the growth of the magnetic field of the resonator, and the resonance frequency of the resonator is changed. In this case, the changing rate of the resonance frequency can be adjusted by changing the cutting number of the trimming electrodes.

(Summary)

As described heretofore, according to the present invention, because it has a so-called strip line construction and because the first electrode pattern pieces do not have portions adjacent to each other, it is possible to improve the Q remarkably.

Furthermore, since the first electrode has a loop shape, the size of the element can be reduced.

In addition, since the impedance can be adjusted just by changing a distance between the input/output terminal and the earth terminal of the first electrode, it is very easy to adjust the impedance.

Additionally, the resonance frequency of the resonator can be adjusted by trimming the trimming electrode which is formed within the earth electrode pattern or connected to the coil electrode pattern. The predetermined resonance frequency can be obtained by adjusting the resonator whose resonance frequency is shifted from a predetermined value. Accordingly, the number inferior devices can be reduced when the resonator is produced.

In these respects, the invention has an effect of providing a very excellent small-sized resonator whose Q is high and whose impedance and resonance frequency can be adjusted optionally.

It will be apparent from the foregoing that, while the present invention has been described in detail and illustrated, these are only particular illustrations and example and the invention is not limited to these. The spirit and scope of the invention is limited only by the appended claims.

What is claimed is:

1. A resonator comprising:
a first electrode formed in a non-spiral loop shape;
a second electrode formed in a plane shape opposite said first electrode with a plate which comprises a dielectric material between said first electrode and said second electrode;
an earth terminal drawn out from said first electrode toward an edge of said plate;
an input/output terminal drawn out from said first electrode toward said edge of said plate at a distance along said edge from said earth terminal, said distance being selected to provide a predetermined impedance; and
another earth terminal drawn out from said second electrode toward said edge of said plate.

2. A resonator according to claim 1, wherein said first electrode comprises strip-shaped electrode pattern pieces having a width, and said first electrode is shaped as a loop which is interrupted by a gap which is no greater in length than said width of said electrode pattern pieces.

3. A resonator according to claim 1, wherein said first electrode is shaped as an uninterrupted loop.

4. A resonator according to claim 1, wherein said first electrode is shaped as a squared loop.

5. A resonator according to claim 1, wherein said first electrode is shaped as a curved loop.

6. A resonator comprising:
a first electrode formed in a non-spiral loop shape;
a pair of second electrodes, each formed in a respective plane shape opposite said first electrode, with a respective plate which comprises a dielectric material being disposed between said first electrode and each said second electrode;
an earth terminal drawn out from said first electrode toward an edge of said plate;
an input/output terminal drawn out from said first electrode toward said edge of said plate at a distance along said edge from said earth terminal, said distance being selected to provide a predetermined impedance; and
another earth terminal drawn out from each said second electrode toward said edge of said plate.

7. The resonator according to claim 6, wherein at least one of said pair of second electrodes is formed with a shape that is similar to but larger than that of said first electrode.

8. A resonator according to claim 6, wherein between said first electrode and at least one of said pair of second electrodes, a third electrode having substantially the same shape as said first electrode is formed.

9. A resonator according to claim 7, wherein on a dielectric plate disposed between said first electrode and at least one of said pair of second electrodes, a third electrode having substantially the same shape as said first electrode is formed.

10. A resonator according to claim 6, further comprising a trimming electrode in a loop shape which is formed in said resonator spaced a distance from one of said pair of second electrodes by a further plate comprising a dielectric material, said further plate being disposed between said trimming electrode and said one second electrode, said trimming electrode being connected to said first electrode.

11. A resonator according to claim 6, wherein at least one trimming electrode is formed in a strip shape within at least one of said pair of second electrodes, and connected thereto.

12. A resonator according to claim 6, wherein said first electrode comprises strip-shaped electrode pattern pieces having a width, and said electrode is shaped as a loop which is interrupted by a gap which is no greater in length than said width of said electrode pattern pieces.

13. A resonator according to claim 6, wherein said first electrode is shaped as an uninterrupted loop.

14. A resonator according to claim 6, wherein said first electrode is shaped as a squared loop.

15. A resonator according to claim 10, wherein said trimming electrode forms a closed loop shape.

16. A resonator according to claim 10, wherein said trimming electrode forms a partial loop shape.

17. A resonator according to claim 6, wherein a plurality of strip-shaped trimming electrodes are formed within at least one of said pair of second electrodes, and connected thereto.

18. A resonator comprising:
a first electrode formed in a non-spiral loop shape;
a second electrode formed in a plane shape opposite said first electrode with a plate which comprises a dielectric material between said first electrode and said second electrode;
an earth terminal drawn out from said first electrode toward a periphery of said plate;
an input/output terminal drawn out from said first electrode toward said periphery of said plate at a distance along said periphery from said earth terminal, said distance being selected to provide a predetermined impedance; and
another earth terminal drawn out from said second electrode toward said periphery of said plate.

19. A resonator comprising:
a first electrode formed in a non-spiral loop shape;
a pair of second electrodes each formed in a respective plane shape opposite said first electrode, with a respective plate which comprises a dielectric material being disposed between said first electrode and each said second electrode;
an earth terminal drawn out from said first electrode toward a periphery of said plate;
an input/output terminal drawn out from said first electrode toward said periphery of said plate at a distance along said periphery from said earth terminal, said distance being selected to provide a predetermined impedance; and
another earth terminal drawn out from each said second electrode toward said periphery of said plate.

* * * * *